United States Patent US 12,395,186 B2
Guo et al. (45) Date of Patent: Aug. 19, 2025

(54) ENCODING APPARATUSES, AND DATA PROCESSING METHODS AND APPARATUSES

(71) Applicant: Alipay (Hangzhou) Information Technology Co., Ltd., Zhejiang (CN)

(72) Inventors: Qingpei Guo, Hangzhou (CN); Wei Chu, Hangzhou (CN)

(73) Assignee: Alipay (Hangzhou) Information Technology Co., Ltd., Zhejiang (CN)

(*) Notice: Subject to any disclaimer, the term of this patent is extended or adjusted under 35 U.S.C. 154(b) by 220 days.

(21) Appl. No.: 18/348,122

(22) Filed: Jul. 6, 2023

(65) Prior Publication Data

US 2024/0137042 A1 Apr. 25, 2024

(30) Foreign Application Priority Data

Jul. 6, 2022 (CN) .......................... 202210789237.7

(51) Int. Cl.
*H03M 7/30* (2006.01)
*G06N 3/0455* (2023.01)
(Continued)

(52) U.S. Cl.
CPC ........ *H03M 7/3082* (2013.01); *G06N 3/0455* (2023.01); *G06F 17/16* (2013.01); *G06N 3/084* (2013.01)

(58) Field of Classification Search
CPC ... H03M 7/3082; G06N 3/0455; G06N 3/084; G06F 17/16
See application file for complete search history.

(56) References Cited

U.S. PATENT DOCUMENTS

2019/0347523 A1 11/2019 Rothberg et al.
2022/0237263 A1* 7/2022 Yamada ................... G06N 3/04

FOREIGN PATENT DOCUMENTS

CN 113792113 A 12/2021
CN 114283430 A 4/2022
WO 2020008272 A1 1/2020

OTHER PUBLICATIONS

Sun et al., "Cross-modal semantic autoencoder with embedding consensus," Scientific Reports, Oct. 13, 2021, 11:20319, 11 pages.

(Continued)

*Primary Examiner* — Joseph J Lauture
(74) *Attorney, Agent, or Firm* — Fish & Richardson P.C.

(57) ABSTRACT

A computer-implemented system for encoding includes an encoding layer and at least one joint encoding unit. The encoding layer encodes a received first modal initial feature vector and a received second modal initial feature vector, to generate, respectively, a first modal feature vector and a second modal feature vector, joint encoded by the at least one joint encoding unit, where the at least one joint encoding unit includes an encoding module and a modal input switching module. The modal input switching module processes the first modal feature vector and the second modal feature vector, to obtain, respectively a first modal switching encoding vector and a second modal switching encoding vector. The encoding module processes the first modal switching encoding vector and the second modal switching encoding vector, to generate, respectively a first target modal fusion vector and a second target modal fusion vector.

20 Claims, 11 Drawing Sheets

(51) Int. Cl.
  *G06F 17/16* (2006.01)
  *G06N 3/084* (2023.01)

(56) References Cited

OTHER PUBLICATIONS

Zhang et al., "Visual question answering model of vision and scene text based on multi-modal reasoning graph neural network." Application Research of Computers, Jan. 2022; 39(1):280-302 (with English abstract).

* cited by examiner

ENCODING APPARATUSES, AND DATA PROCESSING METHODS AND APPARATUSES

CROSS-REFERENCE TO RELATED APPLICATIONS

This application claims priority to Chinese Patent Application No. 202210789237.7, filed on Jul. 6, 2022, which is hereby incorporated by reference in its entirety.

TECHNICAL FIELD

Embodiments of this specification relate to the field of computer technologies, and in particular, to encoding apparatuses.

BACKGROUND

With the development of computer technologies and artificial intelligence, peoples demand for machine perception and reasoning is increasing, day by day, especially the understanding and matching of both image data and text data, image and text matching image and text prediction, etc. which have attracted the interest of many researchers at home and abroad. As a fundamental and critical task in the field of information retrieval and multimedia computing, machine perception and reasoning can not only effectively break the semantic gap and distribution barrier between vision and language, but also promote the development of upper-layer applications (such as cross-modal retrieval, image annotation, visual question answering). However, deep learning models with fixed structures are usually used currently, which can only achieve excellent performance in specific tasks but affect an effect of model usage for more complex tasks.

SUMMARY

In view of this, embodiments of this specification provide encoding apparatuses. One or more embodiments of this specification relate to two data processing methods and apparatuses, computing devices, computer-readable storage mediums, and computer programs, to reduce technical disadvantages in the existing technology.

According to a first aspect of the embodiments of this specification, an encoding apparatus is provided. The encoding apparatus includes an encoding layer and at least one joint encoding unit. The encoding layer encodes a received first modal initial feature vector and a received second modal initial feature vector after being trained, to generate a first modal feature vector and a second modal feature vector. The at least one joint encoding unit performs joint encoding on the first modal feature vector and the second modal feature vector after being trained. The at least one joint encoding unit includes an encoding module and a modal input switching module.

The modal input switching module is configured to process the first modal feature vector and the second modal feature vector, to obtain a first modal switching, encoding vector and a second modal switching encoding vector.

The encoding, module is configured to process the received first modal switching encoding vector and the received second modal switching encoding vector, to generate a first target modal fusion vector and a second target modal fusion vector.

According to a second aspect of the embodiments of this specification, the first data processing method is provided. The first data processing method includes the following: A multimodal data matching request is received, and first modal initial data and second modal initial data that are included in the multimodal data matching request are input into a preprocessing module in an encoding apparatus, to obtain a first multimodal initial feature vector and a second multimodal initial feature vector, where the encoding apparatus is the encoding apparatus in the above-mentioned embodiment. The first multimodal initial feature vector and the second multimodal initial feature vector are input into an encoding layer and at least one joint encoding unit in the encoding apparatus for performing multimodal feature fusion, to obtain a first target multimodal fusion vector and a second target multimodal fusion vector. A pre-trained data matching network is determined based on the multimodal data matching request, and the first target multimodal fusion vector and the second target multimodal fusion vector are input into the data matching network, to generate a data matching result.

According to a third aspect of the embodiments of this specification, the second data processing method is provided. The second data processing method includes the following: A multimodal data prediction request is received, and first modal initial data and second modal initial data that are included in the multimodal data prediction request are input into a preprocessing module in an encoding apparatus, to obtain a first modal initial feature vector and a second nodal initial feature vector, where the encoding apparatus is the encoding apparatus in the above-mentioned embodiments, and the first modal initial data include at least one piece of masked data or the second modal initial data include at least one piece of masked data. The first modal initial feature vector and the second modal initial feature vector are input into an encoding layer and at least one joint encoding unit in the encoding apparatus for performing multimodal feature fusion, to obtain a first target multimodal fusion vector and a second target multimodal fusion vector. A pre-trained data prediction network is determined based on the multimodal data prediction request, and the first target multimodal fusion vector and the second target multimodal fusion vector are input into the data prediction network, to generate a data prediction result.

According to a fourth aspect of the embodiments of this specification, the first data processing apparatus is provided. The first data processing apparatus includes the following: a first feature vector acquisition module, configured to receive a multimodal data matching request, and input first modal initial data and second modal initial data that are included in the multimodal data matching request into a preprocessing module in an encoding apparatus, to obtain a first multimodal initial feature vector and a second multimodal initial feature vector, where the encoding apparatus is the encoding apparatus according, to any one of claims 1 to 6; a first fusion vector acquisition module, configured to input the first multimodal initial feature vector and the second multimodal initial feature vector into an encoding layer and at least one joint encoding unit ii the encoding apparatus for performing multimodal feature fusion, to obtain a first target multimodal fusion vector and a second target multimodal fusion vector; and a data matching module, configured to determine a pre-trained data matching network based on the multimodal data matching request, and input the first target multimodal fusion vector and the second target multimodal fusion vector into the data matching network, to generate a data matching result.

According to a fifth aspect of the embodiments of this specification, the second data processing apparatus is provided. The second data processing apparatus includes the following: a second feature vector acquisition module, configured to receive a multimodal data prediction request, and input first modal initial data and second modal initial data that are included in the multimodal data prediction request into a preprocessing module in an encoding apparatus, to obtain a first modal initial feature vector and a second modal initial feature vector, where the encoding apparatus is the encoding apparatus according to any one of claims 1 to 6, and the first modal initial data or the second modal initial data include at least one piece of masked data; a second fusion vector acquisition module, configured to input the first modal initial feature vector and the second modal initial feature vector into an encoding layer and at least one joint encoding unit in the encoding apparatus for performing multimodal feature fusion, to obtain a first target multimodal fusion vector and a second target multimodal fusion vector; and a data prediction module, configured to determine a pre-trained data prediction network based on the multimodal data prediction request, and input the first target multimodal fusion vector and the second target multimodal fusion vector into the data prediction network, to generate a data prediction result.

According to a sixth aspect of the embodiments of this specification, a computing device is provided. The computing device includes the following: a memory and a processor.

The memory is configured to store computer-executable instructions. The processor is configured to execute the computer-executable instructions. When the computer-executable instructions are executed by the processor, the steps of the two above-mentioned data processing methods are implemented.

According to a seventh aspect of the embodiments of this specification, a computer-readable storage medium is provided. The computer-readable storage medium stores computer-executable instructions. When the computer-executable instructions are executed by a processor, the steps of the two above-mentioned data processing methods are implemented.

According to an eighth aspect of the embodiments of this specification, a computer program is provided. When the computer program is executed on a computer, the computer is enabled to perform the steps of the two above-mentioned data processing methods.

One or more embodiments of this specification provide an encoding apparatus. The encoding apparatus includes an encoding layer and at least one joint encoding unit. The encoding layer encodes a received first modal initial feature vector and a received second modal initial feature vector after being trained, to generate a first modal feature vector and a second modal feature vector. The at least one joint encoding unit performs joint encoding on the first modal feature vector and the second modal feature vector after being trained. The at least one joint encoding unit includes an encoding module and a modal input switching module. The modal input switching module is configured to process the first modal feature vector and the second modal feature vector, to obtain a first modal switching encoding vector and a second anodal switching encoding vector. The encoding module is configured to process the received first modal switching encoding vector and the received second modal switching encoding vector, to generate a first target modal fusion vector and a second target modal fusion vector.

Specifically, the encoding layer and the at least one joint encoding unit in the encoding apparatus encode the first modal initial feature vector and the second anodal initial feature vector. The modal input switching module in the joint encoding unit can switch modal encoding vectors, to obtain the first modal switching encoding vector and the second modal switching encoding vector, and then the encoding module performs modal fusion, to obtain the first target modal fusion vector and the second target modal fusion vector, so that fusion vector representations can be obtained between different modalities, and interaction modes between the modalities are more flexible, thereby enhancing an effect of modal fusion between the different modalities performed by the encoding apparatus, and enhancing a subsequent effect of model usage.

DESCRIPTION OF EMBODIMENTS

Figure 1:
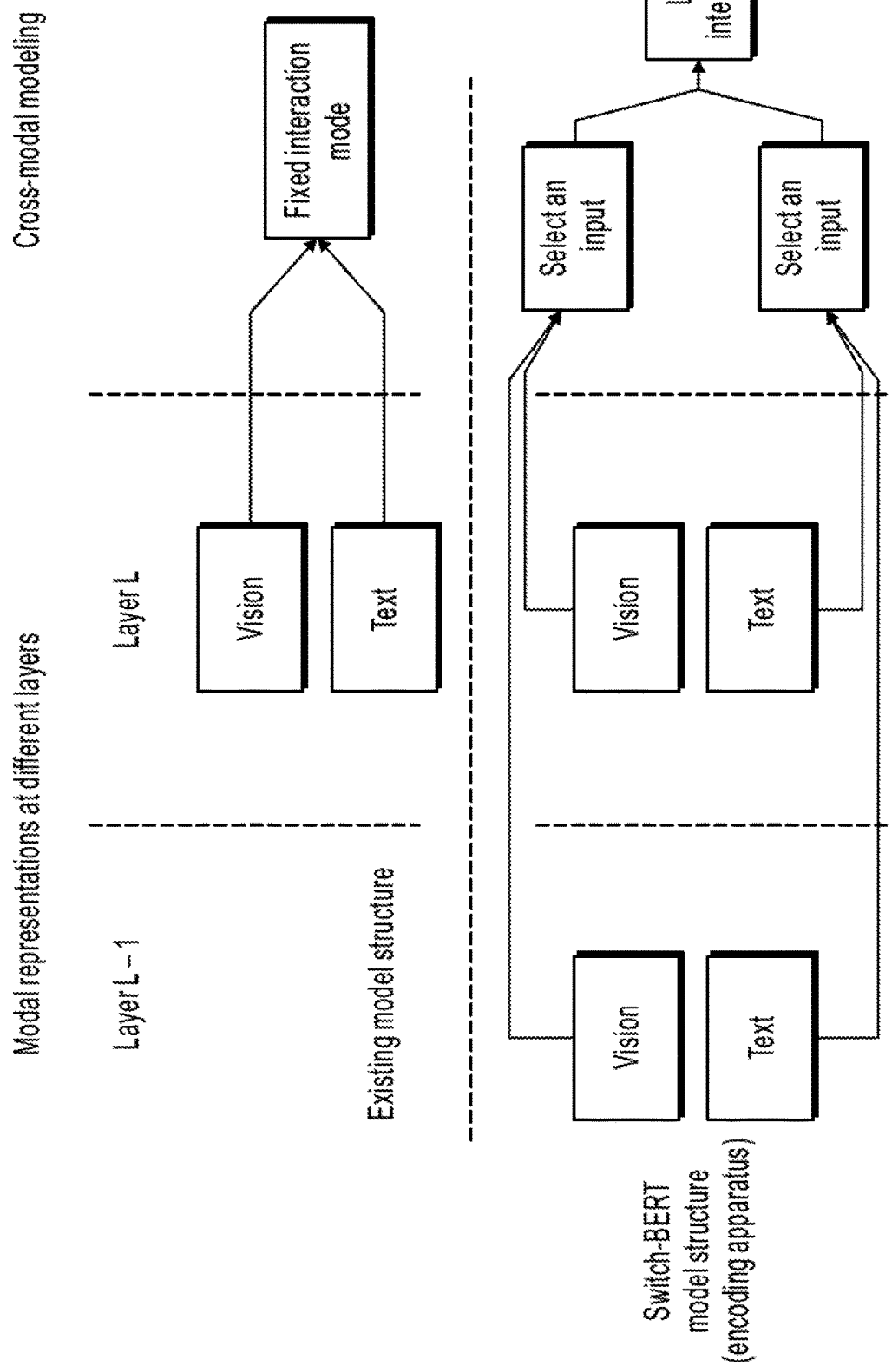
FIG. 1 is a schematic diagram illustrating structure comparison between interaction modes of an existing model structure and a Switch-BERT model structure (an encoding apparatus), according to one or more embodiments of this specification.

In the following descriptions, many specific details are set forth to facilitate a thorough understanding of this specification. This specification, however, can be implemented in many other ways than those described here, and a person skilled in the art can make similar generalization without departing from the spirit of this specification, and therefore this specification is not limited to the specific implementations disclosed below.

Terms used in one or more embodiments of this specification are merely used to describe specific embodiments, and are not intended to limit the one or more embodiments of this specification. The terms "a" and "the" of singular forms used in one or more embodiments of this specification and the appended claims are also intended to include plural forms, unless otherwise specified in the context clearly. It should be further understood that the term "and/or" used in one or more embodiments of this specification indicates and includes any or all possible combinations of one or more associated listed items.

It should be understood that although terms such as "first" and "second" may be used in one or more embodiments of this specification to describe various types of information, the information is not limited to these terms. These terms are merely used to differentiate between information of the same type. For example, without departing from the scope of one or more embodiments of this specification, first can also be referred to as second, and similarly, second can be referred to as first. Depending on the context, for example, the word "if" used here can be explained as "while", "when", or "in response to determining".

First, the terms involved in one or more embodiments of this specification are explained.

Multimodal learning: The development of the mobile Internet is accompanied by the generation of hundreds of millions of pieces of text, image, video, and audio data every day, and a source or form of each piece of information can be referred to as a modality. Multimodal machine learning makes full use of the complementarity and redundancy between multi-source heterogeneous and different modal data to achieve cross-modal content understanding and cognition.

Multimodal fusion: A very critical research point in multimodal research, which integrates information extracted from different modalities into a stable multimodal representation.

The development of the mobile Internet is accompanied by the generation of hundreds of millions of pieces of text, image, video, and audio data every day, and a source or form of each piece of information can be referred to as a modality. Multimodal machine learning makes full use of the complementarity and redundancy between multi-source heterogeneous and different modal data to achieve cross-modal content understanding and cognition. Currently, a data form from a single modality to the fusion of a plurality of modalities is also becoming increasingly important, where the capability of inter-modal interactive, modeling within modalities is the basis for multimodal machine learning. Currently, deep learning models with fixed structures are used, which affects a model effect. The encoding apparatus provided in the embodiments of this specification is to use dynamic networks to learn interactions between a plurality of modalities, and to alleviate this problem by using Switch-BERT for joint multimodal data learning. Switch-BERT extends the BERT architecture by introducing learnable layer-by-layer and cross-layer interactions, to end-to-end learn to optimize interaction modes between the modalities. A feature of the model is that it can adaptively select outputs from different layers, to alleviate the modal mismatch problem.

Referring to FIG. 1, FIG. 1 is a schematic diagram illustrating structure comparison of interaction modes between an existing model structure and a Switch-BERT model structure (an encoding apparatus), according to one or more embodiments of this specification.

In FIG. 1, the upper part is the existing model structure, and the lower part is the Switch-BERT model structure. When fusion of multimodal data is performed, where vision and text are used as an example, in the existing model structure, visual and text data at layer L are based on a fixed interaction mode for cross-modal modeling; but in the Switch-BERT model structure, the lower part in FIG. 1 represents that selection can be further performed on visual and text data, and then cross-modal modeling is performed, to implement a learnable interaction mode, where one of visual data at layer L−1 and visual data at layer L are selected to be input into a model, and one of text data at layer L−1 and text data at layer L are selected to be input into the model, to implement the learnable interaction mode, that is, Switch-BERT can adaptively select inputs at different layers by using a dynamic structure and learn an interaction mode between modalities.

This specification provides encoding apparatuses. This specification also involves two data processing methods and apparatuses, computing devices, computer-readable storage mediums, and computer programs, which are described in detail one by one in the following embodiments.

It is worthwhile to note that the encoding apparatus provided in the embodiments of this specification can be understood as an adjusted Switch-BERT model, and a structure of the original Switch-BERT model is improved, so that the encoding apparatus can select inputs at different layers for feature vectors between different modalities, and select to learn different interaction modes between modalities to perform fusion of modal vectors.

Figure 2:
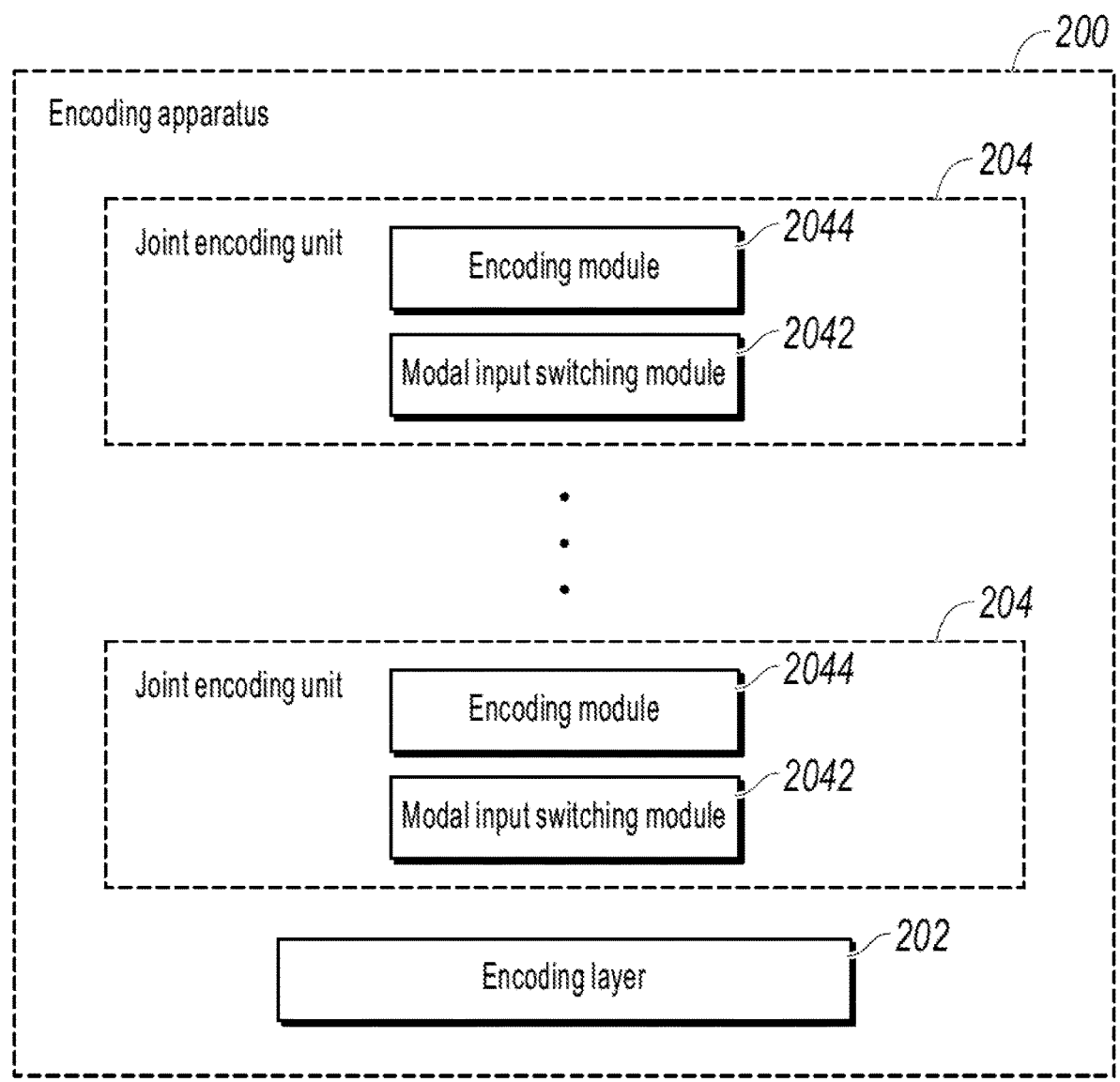
FIG. 2 is a schematic diagram illustrating a structure of an encoding apparatus, according to one or more embodiments of this specification.

FIG. 2 is a schematic diagram illustrating a structure of an encoding apparatus, according to one or more embodiments of this specification.

In FIG. 2, an encoding apparatus 200, an encoding layer 202, and at least one joint encoding unit 204 are included, where the joint encoding unit 204 includes a modal input switching module 2042 and an encoding module 2044.

It is worthwhile to note that the encoding layer 202 can be understood as a layer of the Switch-BERT model, and a quantity of joint encoding units 204 plus a quantity of encoding layers 202 is a total layer quantity that is equal to a quantity of layers in the entire Switch-BERT model. The quantity of layers in the Switch-BERT model is not limited in the embodiments of this specification. For example, there are 12 layers in the Switch-BERT model. In this case, there are 11 layers of joint encoding units 204, where a modal input switching module 2042 and an encoding module 2044 are included at each layer. It is worthwhile to note that in the Switch-BERT model, the modal input switching nodule of each joint encoding unit is not limited in the embodiments here, but the modal input switching module 2042 and the encoding module 2044 are configured in each joint encoding unit in the embodiments.

During specific implementations, the encoding apparatus 200 includes an encoding layer 202 and at least one joint encoding unit 204, where the encoding layer 202 encodes a received first modal initial feature vector and a received second modal initial feature vector after being trained, to generate a first modal feature vector and a second modal feature vector, the at least one joint encoding unit 204 performs joint encoding on the first modal feature vector and the second modal feature vector after being trained, and the at least one joint encoding unit includes an encoding module and a modal input switching module.

The modal input switching module 2042 is configured to process the first modal feature vector and the second modal feature vector, to obtain a first modal switching encoding vector and a second modal switching encoding vector.

The encoding module 2044 is configured to process the received first modal switching encoding vector and the received second modal switching encoding vector, to generate a first target modal fusion vector and a second target modal fusion vector.

The first modal initial feature vector can be understood as a vectorized representation of feature data, for example, an image initial feature vector, of initial data. The second modal initial feature vector can be understood as a vectorized representation of feature data, for example, a text initial feature vector, of initial data. The first modal feature vector can be understood as a feature vector, for example, an image feature vector, obtained after the encoding layer processes modal data. The second modal feature vector can be understood as a feature vector, for example, a text feature vector, obtained after the encoding layer processes modal data. The first modal switching encoding vector can be understood as a feature vector, for example, an image switching encoding vector, obtained after modal feature vectors input into different layers of the encoding module are selected. The second modal switching encoding vector can be understood as a feature vector, for example, a text switching encoding vector, obtained after modal feature vectors input into different layers of the encoding module are selected. The first target modal fusion vector can be understood as an encoded vector, for example, an image fusion vector, obtained after the switching encoding vector is learned based on a self-attention mechanism, fused with a feature of other modal data. The second target modal fusion vector can be understood as an encoded vector, for example, a text fusion vector, obtained after the switching encoding vector is learned based on the self-attention mechanism, fused with a feature of other modal data.

It is worthwhile to note that the encoding apparatus provided in the embodiments of this specification can be understood as a training process after structural changes are performed on the Switch-BERT model. Inputs of the training process are feature vectors of two types of modal data, and an output of the training process is a feature vector obtained after two types of modal features are fused. The encoding apparatus is trained so that output data of the encoding apparatus are increasingly accurate. In this way, a subsequent application effect of models in the application fields of image and text matching, image and text prediction, etc. is becoming better.

The following descriptions of a model training process are illustrated by using an example in which image data are used as first modal data and text data are used as second modal data. However, a specific modal type is not specifically limited in the embodiments of this specification, and audio modal data can be further included.

In actual applications, image modal data and textual modal data are first input into the encoding layer for performing encoding, and then image feature data and textual feature data after the encoding are input into the at least one joint encoding unit, to continue to perform feature vector learning and fusion between modalities, so as to obtain a vector after the image and textual feature data are fused. Further, application of a fusion vector is performed.

In addition, when a quantity of joint encoding units is determined to be two or more, the two or more joint encoding units are used as a joint encoding unit group. Specifically, a quantity of the at least one joint encoding unit is two or more, the two or more joint encoding units constitute a joint encoding unit group, and the joint encoding, unit group is configured to perform joint encoding on the first modal feature vector and the second modal feature vector, to generate the first target modal fusion vector and the second target modal fusion vector.

Output information of a first joint encoding unit in any two adjacent joint encoding units in the joint encoding unit group is input into an input end of a second joint encoding unit.

In actual applications, the joint encoding unit group uses an output of an encoding layer at the first layer as an input of the joint encoding, unit group, and an output of the joint encoding unit group is final output data of the model, where output information of the first joint encoding unit in the any two adjacent joint encoding units in the joint encoding unit group is input into the input end of the second joint encoding unit, for example, output data of a joint encoding unit at layer L is input data of a joint encoding unit at layer L+1. In this way, the joint encoding unit group is enabled to be a structure of repetition of a plurality of joint encoding units. Details are omitted here for simplicity.

Specifically, the encoding layer 202 is further configured to determine a first modal initial feature global vector of the first modal initial feature vector and a second modal initial feature global vector of the second modal initial feature vector; compute an initial feature matching value between the first modal initial feature global vector and the second modal initial feature global vector, and determine an initial feature classification probability value of the initial feature matching value based on a pre-trained initial feature selection classifier; determine a simulated initial feature classification probability value based on the initial feature classification probability value, and select an initial attention mechanism based on the simulated initial feature classification probability value, where the initial attention mechanism includes one of a self-attention mechanism, a first cross self-attention mechanism, a second cross self-attention mechanism, a joint self-attention mechanism; and respectively perform self-attention computation on the first modal initial feature vector and the second modal initial feature vector based on the initial attention mechanism, to generate the first modal feature vector and the second modal feature vector.

The initial feature matching value can be understood as a matching degree between two modal feature vectors that are currently input, for example, a matching degree between an image and a text.

In actual applications, the encoding layer can compute a global vector (which can be obtained through weighted summation) of an image initial feature based on an input image initial feature vector, and compute a global vector (which can be obtained through weighted summation) of a text initial feature based on a text initial feature vector. For details, references can be made to equation (1) described below:

$$z_I^i = \text{AvgPool}(X_I^i), z_I^t = \text{AvgPool}(X_I^t))) \qquad \text{equation (1)}$$

$X_I^i$ can be understood as an image initial feature variable, $X_I^t$ can be understood as a text initial feature variable, $z_I^i$ can be understood as an image initial feature global vector, and $z_I^t$ can be understood as a text initial feature global vector.

Further, after determining the image initial feature global vector and the text initial feature global vector, the encoding layer can further compute an initial feature matching value between the image initial feature global vector and the text initial feature global vector. For details, references can be made to equation (2) described below:

$$d_I = z_I^i \odot z_I^t \quad \text{equation (2)}$$

$d_I$ can be understood as a matching degree between the image initial feature global vector and the text initial feature global vector. The cosine similarity between the two global vectors is computed by using a dot product algorithm.

Furthermore, the encoding layer can determine an initial feature classification probability value of the initial feature matching value by applying a pre-trained initial feature selection classifier. For details, references can be made to equation (3) described below:

$$\pi = \text{Softmax}(f_{MLP}(d_I)) \quad \text{equation (3)}$$

$\pi$ can be understood as a probability value of the matching degree $d_I$ in interaction modes of different mapping space. MLP (Multilayer Perceptron) can be understood as a multilayer perception, where the multilayer perception can have a plurality of hidden layers in addition to an input/output layer, and layers of the multilayer perception are fully connected to each other.

Classifications corresponding to different matching degrees are mapped at the encoding layer by using a pre-trained multilayer perception. It is worthwhile to note that a specific quantity of the classifications is a hyperparameter, and can be predetermined in different application scenarios. In the embodiments of this specification, because the image and the text are two modalities, there can be four combinations of attention mechanisms at a self-attention mechanism layer of the encoding layer, including a self-attention mechanism, a first cross self-attention mechanism, a second cross self-attention mechanism, and a joint self-attention mechanism. The self-attention mechanism can be understood as a self-attention-self-attention mechanism, for example, image data focus only on the image data, and text data focus only on the text data. The first cross self-attention mechanism can be understood as a self-attention-cross-self-attention mechanism, for example, image data focus on the image data, and text data also focus on the image data. The second cross self-attention mechanism can be understood as a cross-self-attention-self-attention mechanism, for example, image data focus on text data, and the text data also focus on the text data. The joint self-attention mechanism can be understood as a joint attention mechanism, for example, image data focus on the image data and text data, and the text data focus on the image data and the text data. Therefore, $\pi$ can be understood as probability values that different attention mechanisms are selected, for example, a probability of selecting the self-attention mechanism is 0.3, a probability of selecting the first cross self-attention mechanism is 0.1, a probability of selecting the second cross self-attention mechanism is 0.2, and a probability of selecting the joint self-attention mechanism is 0.4.

In this case, how to select an attention mechanism during training is currently a main computing task of the encoding layer. To enable different training samples to select diverse attention mechanisms for learning at the encoding layer during training, a current initial feature matching value needs to be disturbed during training, and a sampling noise is added. In this way, a probability value of selecting each attention mechanism is changed. For details, references can be made to equation (4) described below:

$$p(M_n) = \frac{\exp((\log(\pi_n) + g_n)/\tau)}{\sum_{j=1}^{N_a} \exp((\log(\pi_j) + g_j)/\tau)} \quad \text{equation (4)}$$

$M_n$ can be understood as types of different attention mechanisms mapped based on the initial feature matching value, and can be represented as $M_1$, $M_2$, $M_3$, and $M_4$. $g_n$ can be understood as the sampling noise. $\tau$ can be a probability distribution mediation factor.

After a probability value of interaction space of each attention mechanism is determined based on the initial feature matching value, a simulated initial feature classification probability value can be determined in equation (4), for example, a probability of selecting the self-attention mechanism is 0.2, a probability of selecting the first cross self-attention mechanism is 0.4, a probability of selecting the second cross self-attention mechanism is 0.1, and a probability of selecting the joint self-attention mechanism is 0.3.

Further, a final initial attention mechanism can continue to be selected based on the simulated initial feature classification probability value. The initial attention mechanism is one of the self-attention mechanism, the first cross self-attention mechanism, the second cross self-attention mechanism, and the joint self-attention mechanism. For a selection method, references can be made to equation (5) and equation (6):

$$y_{soft} = \sum_{i \in N_a} p(M_i) M_i(X_{input}) \quad \text{equation (5)}$$

$$y_{hard} = M_{n^*}(X_{input}), \, n^* = \underset{n}{\text{argmax}}\{p(M_n)\} \quad \text{equation (6)}$$

For obtaining an input parameter, references can be made to equation (7):

$$X_{input} = X_I^i \cup X_I^t \quad \text{equation (7)}$$

It is worthwhile to note that, equation (5) can be selected to determine the initial attention mechanism during model training, and equation (6) can be selected to determine the initial attention mechanism during model application.

Furthermore, when the initial attention mechanism is determined, multi-head self-attention computations are respectively performed on the image initial feature vector and the text initial feature vector, to generate the image feature vector and the text feature vector.

Figure 3:
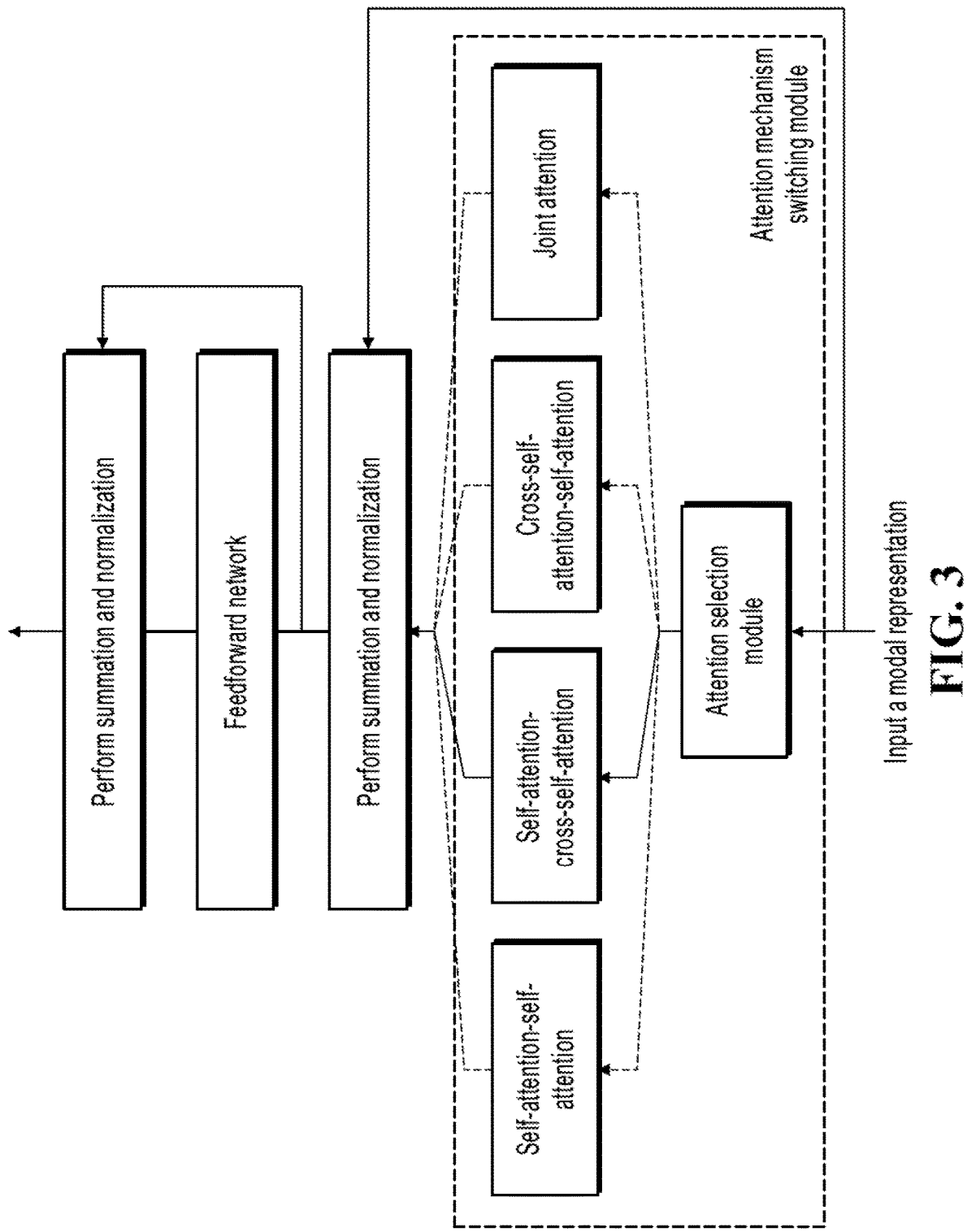
FIG. 3 is a schematic diagram illustrating selection of an attention mechanism in an encoding apparatus, according to one or more embodiments of this specification.

Retelling to FIG. 3, FIG. 3 is a schematic diagram illustrating selection of an attention mechanism in an encoding apparatus, according to one or more embodiments of this specification.

In FIG. 3, an attention mechanism switching module selects the attention mechanism based on an input modal representation. After a self-attention-cross-self-attention mechanism is selected based on the manner described in the above-mentioned embodiments, computation such as summation or normalization is performed on an image initial feature vector and a text initial feature vector based on the self-attention-cross-self-attention mechanism, and then a result is input into a feed-forward network for performing feed-forward computation. Afterwards, computation such as summation or normalization is performed again, and then a result is output.

Selection of a self-attention mechanism at an encoding layer in the encoding apparatus provided in the embodiments of this specification enables a learning mode between different modalities to be more beneficial to feature fusion between the modalities.

The modal input switching module 2042 is further configured to determine a first modal feature global vector of the first modal feature vector and a second modal feature global vector of the second modal feature vector; compute a feature matching value between the first modal feature global vector and the second modal feature global vector, and determine an initial classification probability value of the feature matching value based on a pre-trained feature selection classifier; determine a simulated classification probability value based on the initial classification probability value, and select a target modal feature vector type based on the simulated classification probability value, where the target modal feature vector type includes one of a first modal feature vector and a second modal feature vector of a current modal input switching module, and one of a first modal switching encoding vector and a second modal switching encoding vector that are input into a previous-layer encoding module that the current modal input switching module is connected to; and determine the first modal switching encoding vector and the second modal switching encoding vector based on the target modal feature vector type.

The feature matching value can be understood as a matching degree between global vectors of modalities, and can reflect a matching degree between an image and a text.

In actual applications, the modal input switching module is to select two types of modal data input into an encoding module. In addition, selected objects are an image feature vector and a text feature vector that are at a current encoding unit layer and input into the modal input switching module, and output data namely, an image switching encoding vector and a text switching encoding vector, of the encoding module at a previous encoding unit layer. One of the four vectors is selected in each group and input into the encoding module of the joint encoding unit.

For a specific selection mechanism, references can be made to a selection mode of the self-attention mechanism in the above-mentioned embodiments. Specifically, an image feature global vector and a text feature global vector are computed by referring to equation (1). Then, a feature matching value between the image feature global vector and the text feature global vector is computed by referring to equation (2). Further, an initial classification probability value of the feature matching value is determined by referring to equation (3), and then a simulated classification probability value is determined based on the initial classification probability value, Where references can be made to equation (4). The pre-trained feature selection classifier has the same function as the pre-trained initial feature selection classifier in the above-mentioned embodiments, and only specific content parameters vary. Four mapped modal selection modes can be four types of modes, which are respectively selecting the image feature vector and the text feature vector of the current modal input switching module, selecting the image switching encoding vector input into the previous-layer encoding module that the current modal input switching module is connected to and the text feature vector of the current modal input switching module, selecting the image feature vector of the current modal input switching module and the text switching encoding vector input into the previous-layer encoding module that the current modal input switching module is connected to, and selecting the image switching encoding vector and the text switching encoding vector that are input into the previous-layer encoding module that the current modal input switching module is connected to.

Further, a target modal feature vector type is selected based on the simulated classification probability value. Specifically, references can be made to equation (8) and equation (9) described below:

$$y_{soft} = \sum_{i \in N_c} p(M_c) M_c X^c_{input} \qquad \text{equation (8)}$$

$$y_{hard} = X^{c*}_{input}, \quad c^* = \arg\max\{p(M_c)\} \qquad \text{equation (9)}$$

For an input parameter, references can be made to equation (10):

$$X_{input}{}^c \in \{x_l{}^i \cup x_l{}^t, x_{l-1}{}^i \cup x_l{}^t, x_l{}^i \cup x_{l-1}{}^t, x_{l-1}{}^i \cup x_{l-1}{}^t\} \qquad \text{equation (10)}$$

It is worthwhile to note that equation (8) can be selected to determine the target modal feature vector type during model training and equation (10) can be selected to determine the target modal feature vector type during model application.

Further, the first modal switching encoding vector and the second modal switching encoding vector are determined based on the target modal feature vector type.

Figure 4:
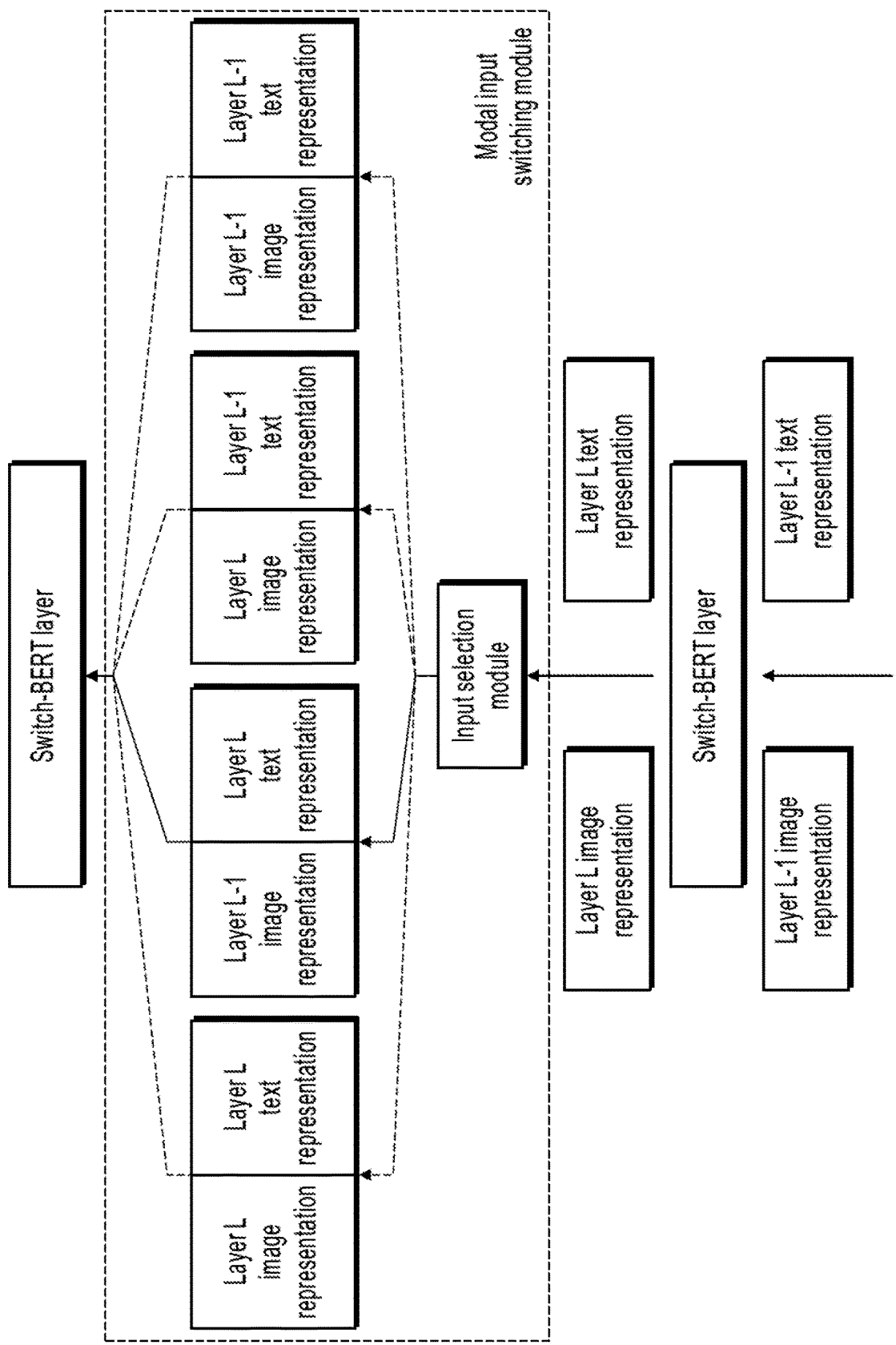
FIG. 4 is a schematic diagram illustrating selection of a modal input feature vector in an encoding apparatus, according to one or more embodiments of this specification.

Referring to FIG. 4, FIG. 4 is a schematic diagram illustrating selection of a modal input feature vector in an encoding apparatus, according to one or more embodiments of this specification.

In FIG. 4, outputs of the lowest Switch-BERT layer are a layer L image representation and a layer L text representation, but a layer L−1 image representation and a layer L−1 text representation are output data of a previous-layer modal input switching module. In this case, after receiving the layer L image representation and the layer L text representation, a modal input switching module continues to respectively compute global vectors of the layer L image representation and the layer L text representation, then determine a feature matching value between a layer L image global representation and a layer L text global representation, and further determine a probability value of each selection mode. As shown in FIG. 4, determined modal inputs are combined into the layer L−1 image representation and the layer L text representation to be input into a next-layer Switch-BERT layer.

In the encoding apparatus provided in the embodiments of this specification, selection of modal feature vectors at different layers enables vector matching between different modalities. In this way, modal feature fusion can be better achieved.

Further, the encoding module 2044 is further configured to determine a first modal switching encoding global vector of the first modal switching encoding vector and a second modal switching encoding global vector of the second modal switching encoding vector; compute a modal matching value between the first modal switching encoding global vector and the second modal switching encoding global vector, and determine an initial matching probability value of the modal matching value based on a pre-trained mode selection classifier; determine a simulated matching probability value based on the initial matching probability value, and select a target attention mechanism based on the simulated matching probability value, wherein the target attention mechanism comprises one of a self-attention mechanism, a first cross self-attention mechanism, a second cross self-attention mechanism, and a joint self-attention mechanism; and respectively perform self-attention computation on the first modal switching encoding vector and the second modal switching encoding vector based on the target attention mechanism, to generate a first modal fusion vector and the second target modal fusion vector.

In actual applications, for selection of an attention mechanism in the encoding module, references can be made to the above-mentioned selection process of the initial attention mechanism at the encoding layer 202. A difference from the above-mentioned selection process of the initial attention mechanism at the encoding layer 202 lies in that an input parameter is different, that is, global vectors corresponding to the first modal switching encoding vector and the second modal switching encoding vector are determined by the encoding module in the embodiments, and the global vectors have different meanings from meanings of the above-mentioned global vector representations at the encoding layer. Specific execution steps are omitted here for simplicity.

In the encoding apparatus provided in the embodiments of this specification, the encoding module can also select the attention mechanism, can evaluate a semantic matching degree between modalities at each layer in a network, and can define interaction mode space of the modalities, to improve an effect of modal fusion of a model.

In addition, the encoding apparatus further includes a preprocessing module.

The preprocessing module is configured to receive multimodal initial data, and determine a data type of the multimodal initial data; determine a position feature of the multimodal data, and extract a data feature of the multimodal initial data; and generate a multimodal initial feature vector based on the data type, the position feature, and the data feature, where the multimodal initial feature vector includes the first modal initial feature vector and the second modal initial feature vector.

The data type can be understood as a type of modal data. For example, a data type of image data can be identified as type 0, and a data type of text data can be identified as type 1. The position feature can be understood as position information of a data feature. For example, a position of each region in the image data is a region position, and a sequence position of text in the text data is a word position. The data feature can be understood as a feature of data corresponding to each position feature. For example, a feature of data at each region position in the image data is a region feature, and a feature of data at each word position in the text data is a word feature.

In actual applications, the preprocessing module in the encoding apparatus can determine the data type of the received multimodal initial data, then determine a multimodal position feature, further extract a corresponding data feature, and then generate a multimodal initial feature vector at an embedding layer. For details, referring to FIG. 5, FIG. 5 is a schematic diagram illustrating generation of initial feature vectors at a vision embedding layer and a text embedding layer in an encoding apparatus, according to one or more embodiments of this specification.

Figure 5:
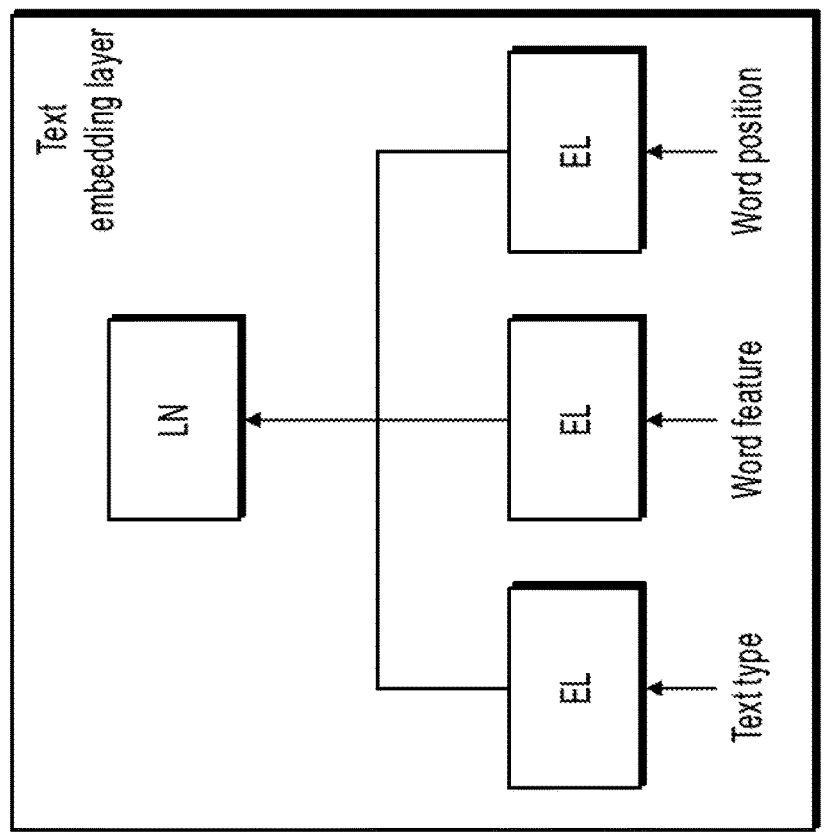
FIG. 5 is a schematic diagram illustrating generation of initial feature vectors at a vision embedding layer and a text embedding layer in an encoding apparatus, according to one or more embodiments of this specification.
Figure 5:
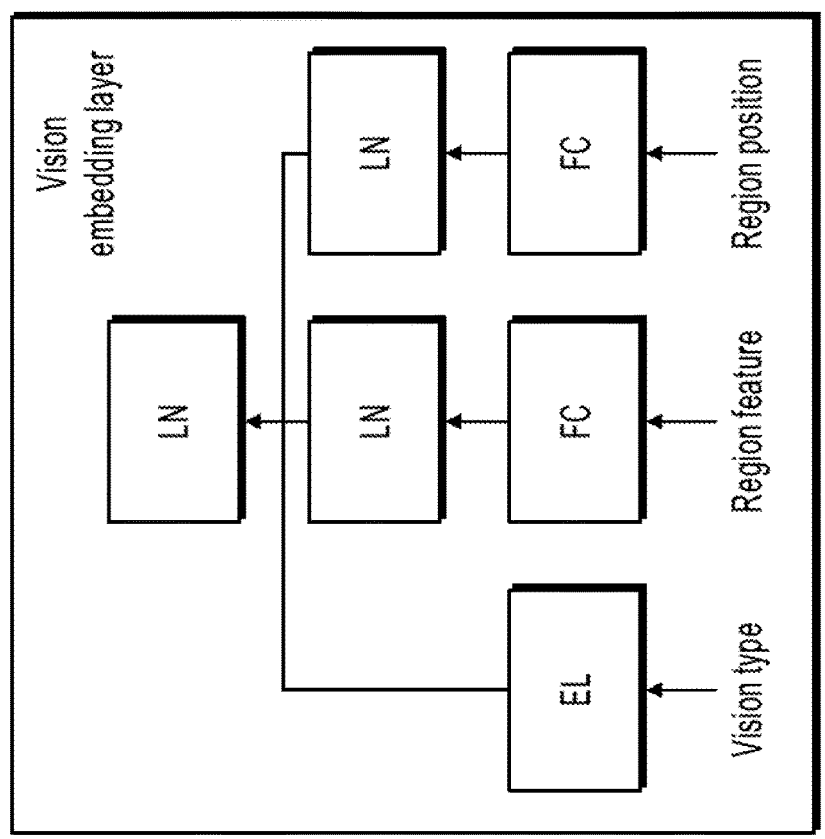

FIG. 5(*a*) is a schematic diagram illustrating processing at the vision embedding layer. FIG. 5(*b*) is a schematic diagram illustrating processing at the text embedding layer.

Specifically, in FIG. 5(*a*), for the vision embedding layer, a modality, is first determined as a vision-type modality from multimodal initial data, that is, a vision-type representation is input into the vision embedding layer, then a region position and a region feature of each region in an image are determined from the multimodal initial data, and then the vision type, the region feature, and the region position are input into the vision embedding layer to output an image initial feature vector (a visual representation). In FIG. 5(*b*), for the text embedding layer, a modality is first determined as a text modality from multimodal initial data, that is, a text-type representation is determined and input into the text embedding layer, then a word position and a word feature of initial text data are determined, then the text type, the word feature, and the word position are input into the text embedding layer, and finally a text initial feature vector (a text representation) is output. It is worthwhile to note that a specific implementation process of the embedding layer is not specifically limited in the embodiments of this specification.

In the encoding apparatus provided in the embodiments of this specification, modal initial feature vectors of different modalities are generated, to be subsequently input into an encoding layer and at least one joint encoding unit, so that feature fusion is performed between the modalities.

Figure 6:
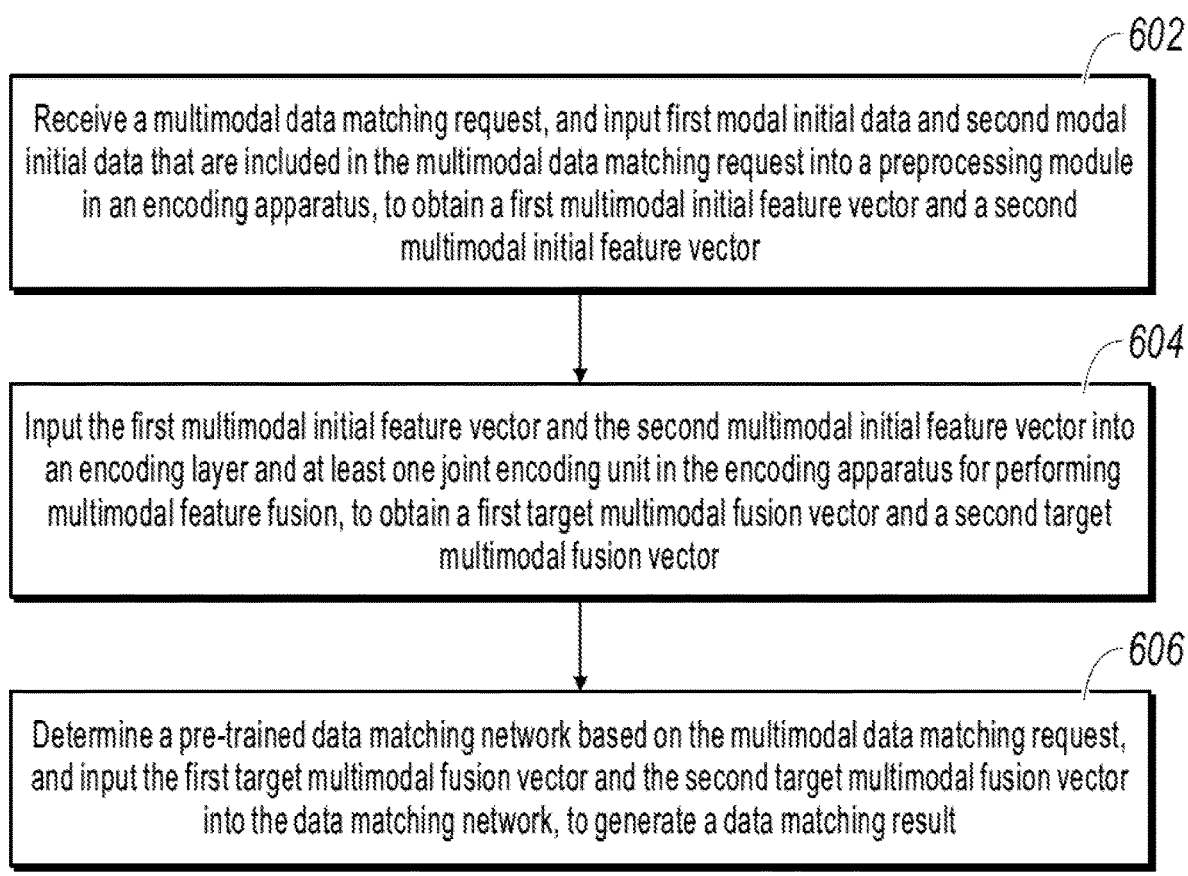
FIG. 6 is a flowchart illustrating the first data processing method, according to one or more embodiments of this specification.

Other embodiments of this specification provide the first data processing method. Referring to FIG. 6, FIG. 6 is a flowchart illustrating the first data processing method, according to one or more embodiments of this specification. The following steps are specifically included.

Step 602: Receive a multimodal data matching request, and input first modal initial. data and second modal initial data that are included in the multimodal data matching request into a preprocessing module in an encoding apparatus, to obtain a first multimodal initial feature vector and a second multimodal initial feature vector, where the encoding apparatus is the encoding apparatus in the above-mentioned embodiment.

The multimodal data matching request can be understood as a data matching request between different modalities, for example, a matching request between an image and a text. The data processing method is described by using an image-text matching application scenario as an example in one or more embodiments of this specification, but a specific multimodal data type is not limited.

In actual applications, after receiving an image-text matching request, a server first respectively inputs image data and text data into a preprocessing module of the encoding apparatus, and respectively extracts features of the image data and the text data based on a vision embedding layer and a text embedding layer in the preprocessing module, to generate a visual representation and a text representation. It is worthwhile to note that, for a data processing process of the encoding apparatus and the preprocessing module in the encoding apparatus that are mentioned in the embodiments, references can be made to a data processing process of the encoding apparatus and the preprocessing module that are described in the above-mentioned embodiment. Implementations are not limited in the embodiments.

Step 604: Input the first multimodal initial feature vector and the second multimodal initial feature vector into an encoding layer and at least one joint encoding unit in the encoding apparatus for performing multimodal feature fusion, to obtain a first target multimodal fusion vector and a second target multimodal fusion vector.

Further, the server can input the visual representation and the text guarantee into the encoding layer of the encoding apparatus for performing encoding, and then input output data of the encoding layer into the at least one joint encoding unit. The joint encoding unit includes a modal input switching module and an encoding module. It is worthwhile to note that an attention mechanism adapted to learning of fusion between current image and text representation data needs to be selected based on similarity between an image representation and a text representation in both the encoding layer and the encoding module. In addition, the modal input switching module performs selection on an image representation and a text representation, of input data input into the encoding module, at different layers. For a specific process of determining the attention mechanism and a specific process of selecting the modal input switching module, references can be made to the descriptions of the above-mentioned embodiment. Details are omitted here for simplicity.

Step 606: Determine a pre-trained data matching network based on the multimodal data matching request, and input the first target multimodal fusion vector and the second target multimodal fusion vector into the data matching network, to generate a data matching result.

The pre-trained data matching network can be understood as an initial network model for image-text matching, and has an image-text matching function. However, because the initial network model for image-text matching has relatively low performance, and a training program of image-text matching is low, the pre-trained data matching network has a relatively poor effect. Therefore, in the data processing method provided in the embodiments of this specification, the encoding apparatus first fuses a visual feature and a text feature, and then implements image-text matching between the fused visual feature and text feature by using the pre-trained data matching network, to improve accuracy of a matching result of image-text matching.

Furthermore, the server can further determine the pre-trained data matching network based on the image-text matching request, and input an image fusion vector and a text fusion vector that are fused by the encoding module into the data matching network, to further generate a data matching result. In addition, an implementation effect of the data matching result is better than an implementation effect of using the pre-trained data matching network alone.

In addition, in other embodiments of this specification, an application scenario, namely, an image retrieval scenario, can be further provided. Specifically, before the multimodal data matching request is received, the method further includes the following steps:

An image data retrieval request is received, and at least two texts that are to be matched are determined based on an image that is to be retrieved and that is included in the image data retrieval request.

The multimodal data matching request is generated based on the image that is to be retrieved and the at least two texts that are to be matched.

Correspondingly, after the data matching result is generated, the method further includes the following:

A matching text corresponding to the image that is to be retrieved is constructed based on the data matching result and from the at least two texts that are to be matched.

Alternatively, before the multimodal data matching request is received, the method further includes the following:

A text data retrieval request is received, and at least two images that are to be matched are determined based on a text that is to be retrieved and that is included in the text data retrieval request.

The multimodal data matching request is generated based on the text that is to be retrieved and the at least two images that are to be matched.

Correspondingly, after the data matching result is generated, the method further includes the following:

A matching image corresponding to the text that is to be retrieved is constructed based on the data matching result and from the at least two images that are to be matched.

It is worthwhile to note that the image and text retrieval scenario includes determining whether one or more of at least two pieces of text data that are retrieved match a target image, and determining whether one or more of at least two pieces of image data that are retrieved match a target text.

Therefore, in actual applications, a description is provided by using an example in which the server receives the image data retrieval request.

Specifically, after receiving the image data retrieval request, the server can obtain text data, through filtering from a retrieval engine based on the included image that is to be retrieved, that matches the image that is to be retrieved. For example, a retrieval result of the retrieval engine shows that there are 50 pieces of data. Ten pieces of text data can be obtained through filtering based on fine sorting in the retrieval engine. Then, the image that is to be retrieved and the ten pieces of text data are input into the encoding apparatus for performing fusion between an image feature and a text feature, and a vector obtained after the fusion is input into a pre-trained image-text matching network, to obtain a data matching result. A matching text corresponding to the image that is to be retrieved is determined from the ten pieces of text data based on the data matching result. In this case, an image and text retrieval task is completed.

In addition, a processing process of retrieving text data is consistent with the processing process of retrieving image data. Details are omitted here for simplicity.

In conclusion, in the data processing method provided in the embodiments of this specification, the encoding apparatus performs modal fusion on the image feature data and the textual feature data, to be input into the pre-trained image-text matching network, so that an image-text matching result of a model can be more accurately achieved.

Figure 7:
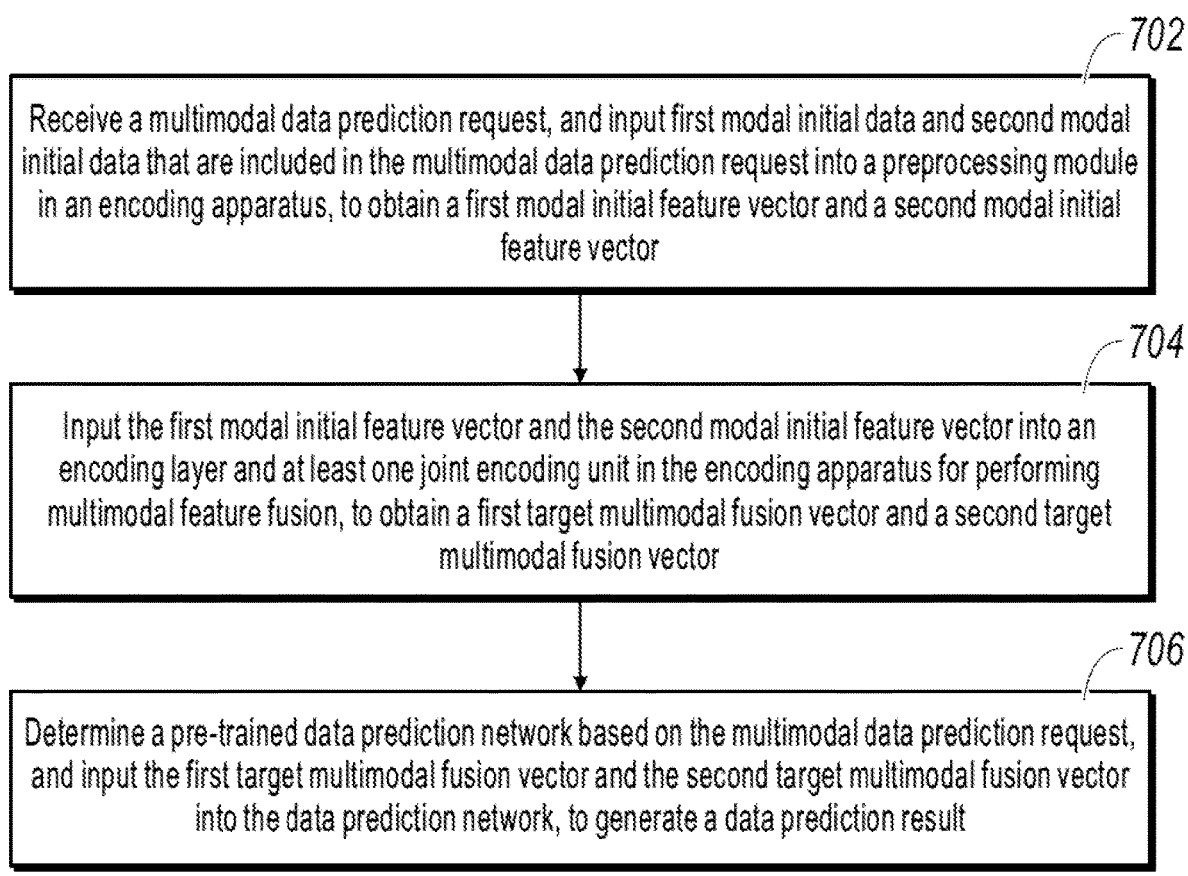
FIG. 7 is a flowchart illustrating the second data processing method, according to one or more embodiments of this specification.

Other embodiments of this specification provide the second data processing method. Referring to FIG. 7, FIG. 7 is a flowchart illustrating the second data processing method, according to one or more embodiments of this specification. The following steps are specifically included.

Step 702: Receive a multimodal data prediction request, and input first modal initial data and second modal initial data that are included in the multimodal data prediction request into a preprocessing module in an encoding apparatus, to obtain a first modal initial feature vector and a second modal initial feature vector, where the encoding apparatus is the encoding apparatus in the above-mentioned embodiments, and the first modal initial data include at least one piece of masked data or the second modal initial data include at least one piece of masked data.

The multimodal data prediction request can be understood as a request for predicting modal data that is masked between different modalities. For example, if a feature of input image data is complete, but text data corresponding to the image data are partially masked, the masked text data can be predicted; if a feature of input text data is complete, but a partial region of image data corresponding to the text data is masked, the masked region of the image data can be predicted. It is worthwhile to note that content of a masked part of data is not limited in the multimodal data prediction request, and different network models can be trained based on different application scenarios, to satisfy corresponding application demands. A text data prediction request is used as an example for description below.

In actual applications, a server inputs initial image data and initial text data that are included in the text data prediction request into the preprocessing module of the encoding apparatus for performing processing. Random masking is performed on the initial text data. For example, the initial text data are "I love China". After random masking is performed, a word feature of the word "love" can be masked, to be further used in subsequent text data processing. The masked word is predicted by the encoding apparatus through a masked language modeling network.

Step 704: Input the first modal initial feature vector and the second modal initial feature vector into an encoding layer and at least one joint encoding unit in the encoding apparatus for performing multimodal feature fusion, to obtain a first target multimodal fusion vector and a second target multimodal fusion vector.

Further, the server inputs an image initial feature vector and a text initial feature vector that are output from the preprocessing module of the encoding apparatus into the encoding apparatus and the at least one joint encoding unit for performing multimodal fusion, to obtain a fused image fusion vector and a fused text fusion vector. For the encoding apparatus and the at least one joint encoding unit, references can be made to the descriptions of the above-mentioned embodiments. Details are omitted here for simplicity.

Step 706: Determine a pre-trained data prediction network based on the multimodal data prediction request, and input the first target multimodal fusion vector and the second target multimodal fusion vector into the data prediction network, to generate a data prediction result.

The pre-trained data prediction network can be understood as pre-trained masked region classification network or a masked language modeling network. In the application of predicting a masked region of an image, the pre-trained masked region classification network can be used. In the application of predicting masked content of text, the pre-trained masked language modeling network can be used.

In actual applications, the fused image fusion vector and the fused text fusion vector are processed based on different data prediction networks, to generate a corresponding data prediction result.

In conclusion, in the data processing method provided in the embodiments of this specification, the encoding apparatus performs modal fusion on the image feature data and the textual feature data, to be input into the pre-trained data prediction network, so that an image or text prediction result of a model can be more accurately achieved.

Figure 8:
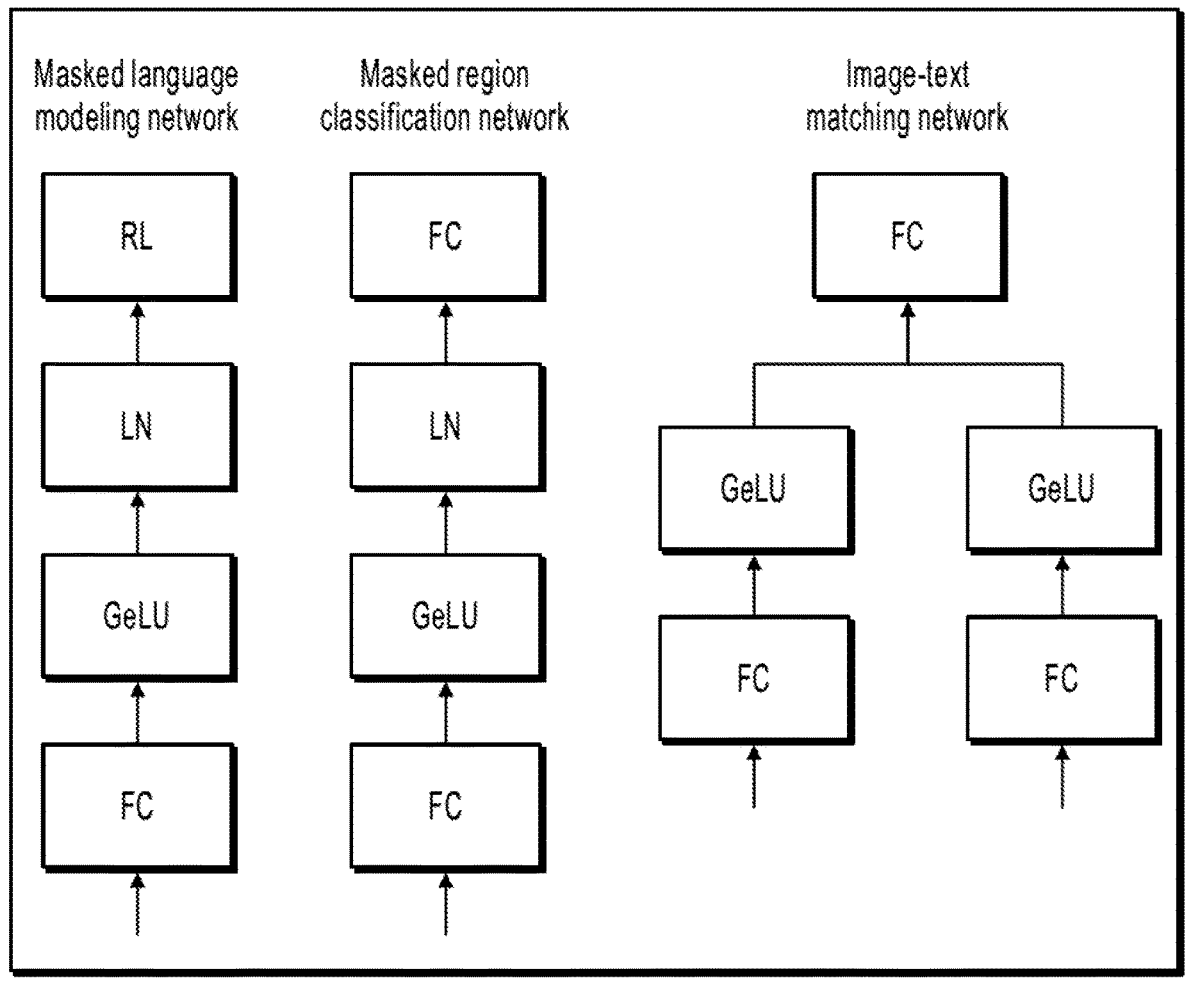
FIG. 8 is a schematic diagram illustrating training processes of an image-text matching network, a masked language modeling network, and a masked region classification network in a data processing method, according to one or more embodiments of this specification.

Referring to FIG. 8, FIG. 8 is a schematic diagram illustrating training processes of an image-text matching network, a masked language modeling network, and a masked region classification network in a data processing method, according to one or more embodiments of this specification.

It is worthwhile to note that the image-text matching network, the masked language modeling network, and the masked region classification network are pre-trained during application. If the encoding apparatus does not perform fusion on features between modalities, the image-text matching network, the masked language modeling network, and the masked region classification network have a poor application effect. However, after the encoding apparatus performs fusion on the features between modalities, an effect of implementing an image-text matching task and an image or text prediction task of a model can be improved.

Figure 9:
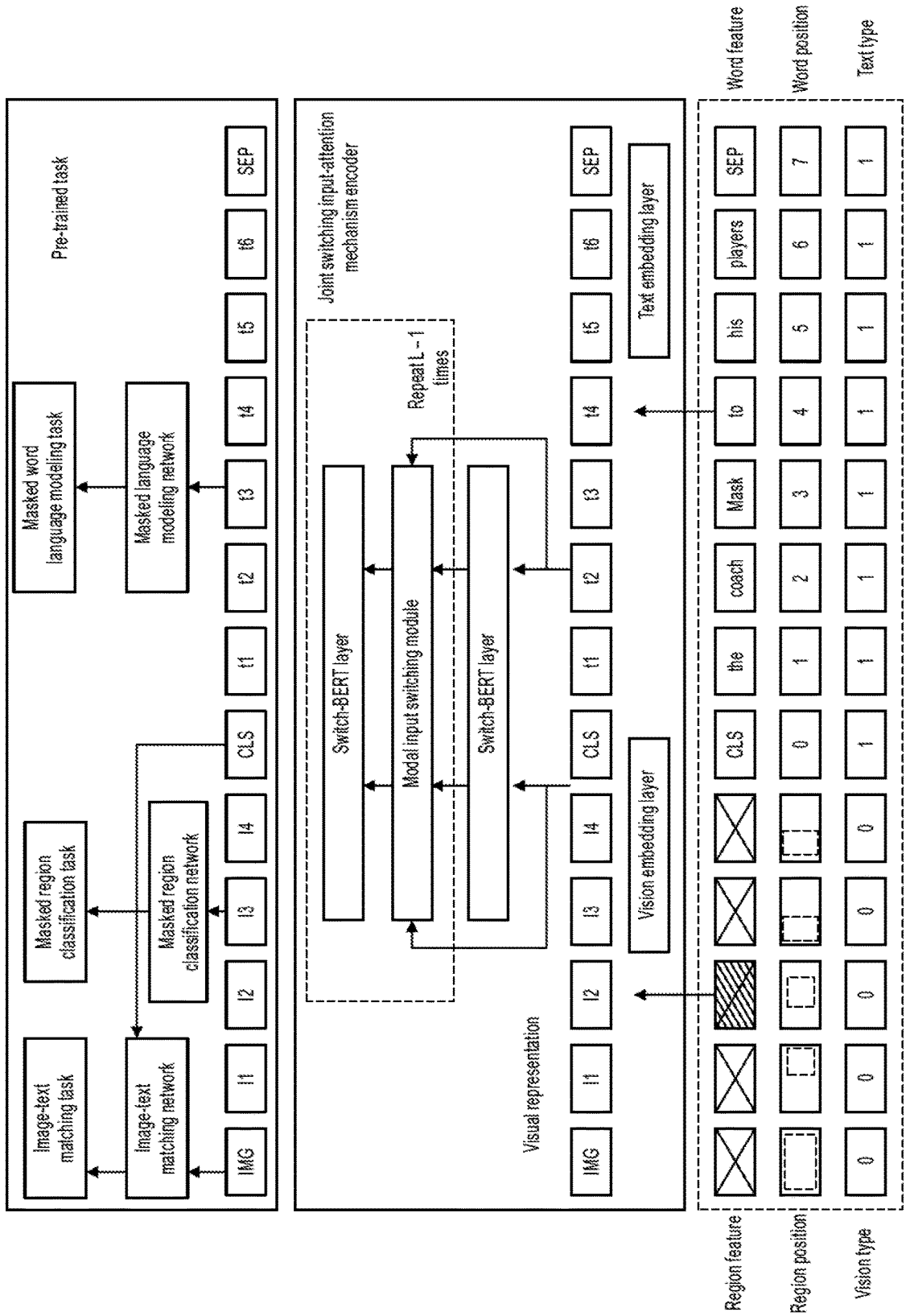
FIG. 9 is a schematic diagram illustrating a processing process of application of a model in a data processing method, according to one or more embodiments of this specification.

Referring to FIG. 9, FIG. 9 is a schematic diagram illustrating a processing process of application of a model in a data processing method, according to one or more embodiments of this specification.

It is worthwhile to note that, in FIG. 9, the upper part is a schematic diagram illustrating a pre-trained task, the middle part is a joint switching input-attention mechanism encoder, and the lower part is input data of a model. A description is provided by using an application process of the model in FIG. 9 as an example in the embodiments of this specification. In addition, the process can also be understood as a process of training the joint switching input-attention mechanism encoder by using a large amount of training sample data. The process in combination with the image-text matching network, the masked region classification network, and the masked language modeling network in the previous pre-trained task can be understood as a pre-trained model that is needed in a processing task after the application of the joint switching input-attention mechanism encoder is performed.

In actual applications, data in the dashed box region in FIG. 9 is initial training data. A description is provided by using an example in which the initial training data are image data and text data. A visual representation is generated after the image data are input into a vision embedding layer of the joint switching input-attention mechanism encoder. Specifically, the image data include vision type 0, region position information, and a region feature. The region position information can be understood as position information in each critical region. The region feature is a region feature in the region position information. In addition, the first piece of feature data in the region feature can be represented as global feature data of an entire image, and the other feature data are region feature data. A text representation is generated after the text data are input into a text embedding layer of the joint switching input-attention mechanism encoder. Specifically, the text data include text type 1, word position information, and a word feature. The word position information can be determined based on an expression order of the text data. In addition, the first piece of feature data of the word feature includes CLS full semantic information.

Further, the visual representation and the text guarantee are input into the first-layer Switch-BERT layer of the joint switching input-attention mechanism encoder, and then output data are input into a modal input switching module in the dashed box in the joint switching input-attention mechanism encoder in FIG. 9. Further, output data of the modal input switching module are input into a next-layer Switch-BERT layer. It is worthwhile to note that the modal input switching module constitutes a repeatable unit together with another Switch-BERT layer other than the first-layer Switch-BERT layer. After a total quantity of layers in the joint switching input-attention mechanism encoder is determined to be L, there are L−1 layers of repeatable units. Therefore, image data fused with a text feature and text data fused with an image feature are finally output from the joint switching input-attention mechanism encoder.

Furthermore, fused data are input into any pre-trained model in the image-text matching network, the masked region classification network, or the masked language modeling network based on different processing tasks, to further complete a corresponding image-text matching task, masked region classification task, and masked word language modeling task.

It is worthwhile to note that, in a training and application process, in the image-text matching task, masking processing does not need to be performed on the initial training data when the initial training data are the image data and the text data; in an image and text prediction task, masking processing can be correspondingly performed on the initial training data when the initial training data are the image data or the text data (where for example, in FIG. 9, an affected part of the image data is content on which random masking is performed, and masked text of the text data represents a part on which random masking is performed).

In conclusion, in the data processing method provided in the embodiments of this specification, the joint switching input-attention mechanism encoder is used to strengthen modal fusion between the image data and the text data, and data obtained after the modal fusion is used to perform a specific execution task, so that a task processing effect can be improved.

Figure 10:
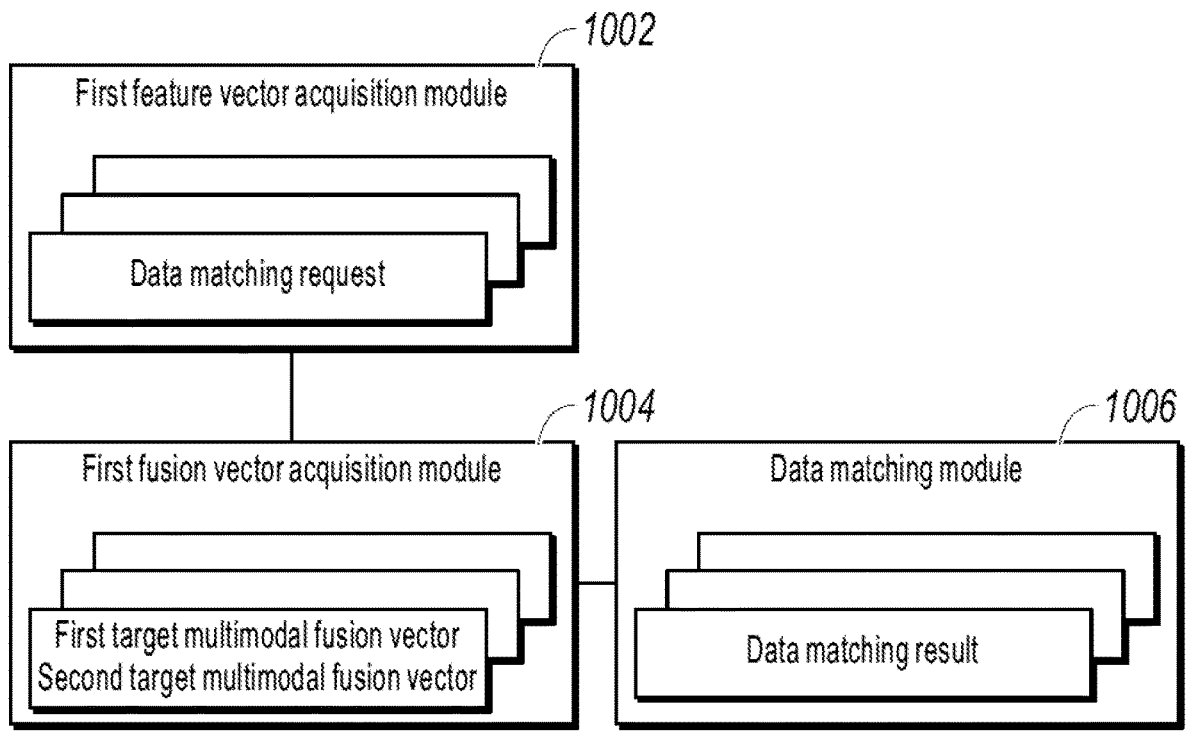
FIG. 10 is a schematic diagram illustrating a structure of the first data processing apparatus, according to one or more embodiments of this specification.

Corresponding to the above-mentioned embodiments, this specification further provides data processing apparatus embodiments. FIG. 10 is a schematic diagram illustrating a structure of the first data processing apparatus, according to one or more embodiments of this specification. As shown in FIG. 10, the apparatus includes: a first feature vector acquisition module 1002, configured to receive a multimodal data matching request, and input first modal initial data and second modal initial data that are included in the multimodal data matching request into a preprocessing module in an encoding apparatus, to obtain a first multimodal initial feature vector and a second multimodal initial feature vector, where the encoding apparatus is the encoding apparatus in the above-mentioned embodiment; a first fusion vector acquisition module 1004, configured to input the first multimodal initial feature vector and the second multimodal initial feature vector into an encoding layer and at least one joint encoding unit in the encoding apparatus for performing multimodal feature fusion, to obtain a first target multimodal fusion vector and a second target multimodal fusion vector; and a data matching module 1006, configured to determine a pre-trained data matching network based on the multimodal data matching request, and input the first target multimodal fusion vector and the second target multimodal fusion vector into the data matching network, to generate a data matching result.

Optionally, the apparatus further includes: a first receiving module, configured to receive an image data retrieval request, and determine at least two texts that are to be matched based on an image that is to be retrieved and that is included in the image data retrieval request; and generate the multimodal data matching request based on the image that is to be retrieved and the at least two texts that are to be matched; and a first matching module, configured to construct, based on the data matching result and from the at least two texts that are to be matched, a matching text corresponding to the image that is to be retrieved; or a second receiving module, configured to receive a text data retrieval request, and determine at least two images that are to be matched based on a text that is to be retrieved and that is included in the text data retrieval request; and generate the multimodal data matching request based on the text that is to be retrieved and the at least two images that are to be matched; and a second matching module, configured to construct, based on the data matching result and from the at least two images that are to be matched, a matching image corresponding to the text that is to be retrieved.

According to the data processing apparatus provided in the embodiments of this specification, the encoding apparatus performs modal fusion on the image feature data and the textual feature data, to be input into the pre-trained image-text matching network, so that an image or text matching result of a model can be more accurately achieved.

The above-mentioned descriptions are an example solution of the data processing apparatus in the embodiments. It is worthwhile to note that the technical solution of the data processing apparatus pertains to the same concept as the technical solution of the above-mentioned data processing method. For details not described in detail in the technical solution of the data processing apparatus, references can be made to the descriptions of the technical solution of the above-mentioned data processing method.

Figure 11:
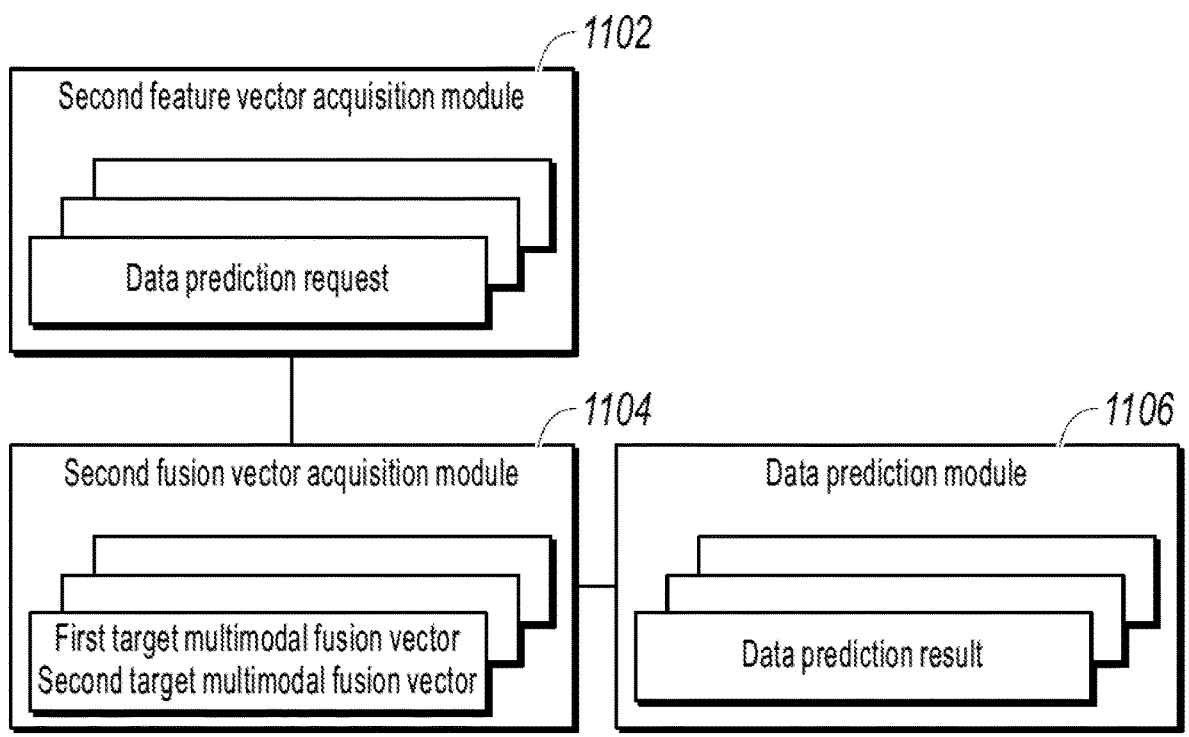
FIG. 11 is a schematic diagram illustrating a structure of the second data processing apparatus, according to one or more embodiments of this specification.

Corresponding to the above-mentioned embodiment, this specification further provides a data processing apparatus embodiment. FIG. 11 is a schematic diagram illustrating a structure of the second data processing apparatus, according to one or more embodiments of this specification. As shown in FIG. 11, the apparatus includes: a second feature vector acquisition module 1102, configured to receive a multimodal data prediction request, and input first modal initial data and second modal initial data that are included in the multimodal data prediction request into a preprocessing module in an encoding apparatus, to obtain a first modal initial feature vector and a second modal initial feature vector, where the encoding apparatus is the encoding apparatus in the above-mentioned embodiment, and the first modal initial data or the second modal initial data include at least one piece of masked data; a second fusion vector acquisition module 1104, configured to input the first modal initial feature vector and the second modal initial feature vector into an encoding layer and at least one joint encoding unit in the encoding apparatus for performing multimodal feature fusion, to obtain a first target multimodal fusion vector and a second target multimodal fusion vector; and a data prediction module 1106, configured to determine a pre-trained data prediction network based on the multimodal data prediction request, and input the first target multimodal fusion vector and the second target multimodal fusion vector into the data prediction network, to generate a data prediction result.

According to the data processing apparatus provided in the embodiments of this specification, the encoding apparatus performs modal fusion on the image feature data and the textual feature data, to be input into the pre-trained data prediction network, so that an image or text prediction result of a model can be more accurately achieved.

The above-mentioned descriptions are an example solution of the data processing apparatus in the embodiments. It is worthwhile to note that the technical solution of the data processing apparatus pertains to the same concept as the technical solution of the above-mentioned data processing method. For details not described in detail in the technical solution of the data processing apparatus, references can be made to the descriptions of the technical solution of the above-mentioned data processing method.

Figure 12:
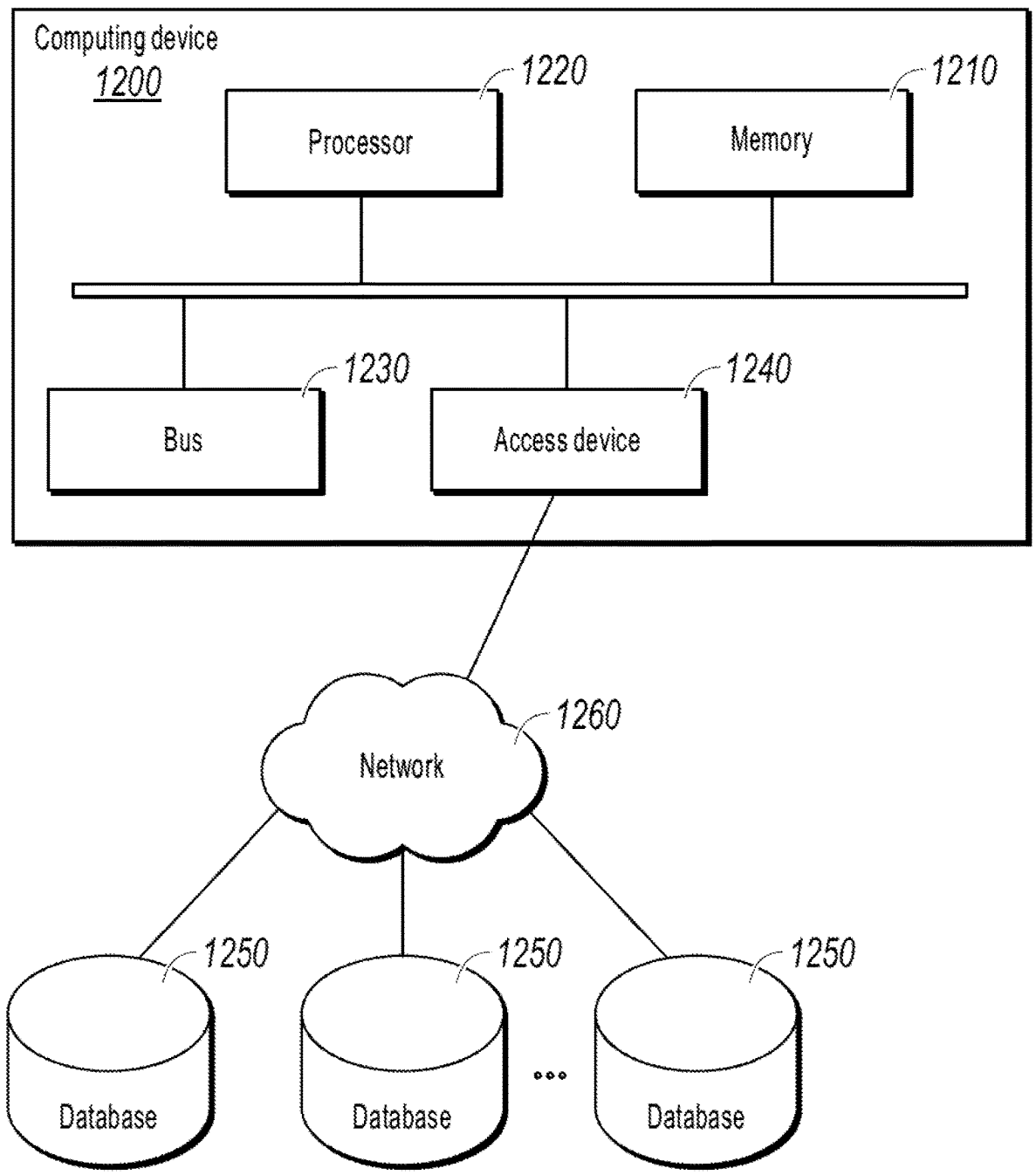
FIG. 12 is a block diagram illustrating a structure of a computing device, according to one or more embodiments of this specification.

FIG. 12 is a block diagram illustrating a structure of a computing device 1200, according to one or more embodiments of this specification. Components of the computing device 1200 include but are not limited to a memory 1210 and a processor 1220. The processor 1220 is connected to the memory 1210 through a bus 1230, and a database 1250 is configured to store data.

The computing device 1200 further includes an access device 1240, and the access device 1240 enables the computing device 1200 to perform communication via one or more networks 1260. Examples of such networks include a public switched telephone network (PSTN), a local area network (LAN), a wide area network (WAN), a personal area network (PAN), or a combination of communication networks such as the Internet. The access device 1240 can include one or more of any type of wired or wireless network interface (for example, a network interface card (NIC)), for example, an IEEE 802.11 wireless local area network (WLAN) wireless interface, a Worldwide Interoperability for Microwave Access (WiMAX) interface, an Ethernet interface, a Universal Serial Bus (USB) interface, a cellular network interface, a Bluetooth interface, or a near field communication (NFC) interface.

In one or more embodiments of this specification, the above-mentioned components of the computing device 1200 and other components not shown in FIG. 12 can also be connected to each other, for example, through a bus. It should be understood that the block diagram illustrating the structure of the computing device shown in FIG. 12 is for purposes of example only and is not intended to limit the scope of this specification. Other components can be added or substituted as desired by a person skilled in the art.

The computing device 1200 can be any type of stationary or mobile computing device, including a mobile computer or a mobile computing device (for example, a tablet computer, a personal digital assistant, a laptop computer, a notebook computer, or a netbook), a mobile phone (for example, a smartphone), a wearable computing device (for example, a smart watch or smart glasses), another type of mobile device, or a stationary computing device such as a desktop computer or a PC. Alternatively, the computing device 1200 can be a mobile or stationary server.

The processor 1220 is configured to execute computer-executable instructions, and when the computer-executable instructions are executed by the processor, the steps of the above-mentioned data processing method are implemented.

The above-mentioned descriptions are example solutions of the computing device in the embodiments. It is worthwhile to note that the technical solution of the computing device pertains to the same concept as the technical solution of the above-mentioned data processing method. For details not described in detail in the technical solution of the computing device, references can be made to the descriptions of the technical solution of the above-mentioned data processing method.

One or more embodiments of this specification further provide a computer-readable storage medium. The computer-readable storage medium stores computer-executable instructions, and when the computer-executable instructions are executed by a processor, the steps of the above-mentioned data processing method are implemented.

The above-mentioned descriptions are an example solution of the computer-readable storage medium in the embodiments. It is worthwhile to note that the technical solution of the storage medium pertains to the same concept as the technical solution of the above-mentioned data processing method. For details not described in detail in the technical solution of the storage medium, references can be made to the descriptions of the technical solution of the above-mentioned data processing method.

One or more embodiments of this specification further provide a computer program. When the computer program is executed on a computer, the computer is enabled to perform the steps of the above-mentioned data processing method.

The above-mentioned descriptions are an example solution of the computer program in the embodiments. It is worthwhile to note that the technical solution of the computer program pertains to the same concept as the technical solution of the above-mentioned data processing method. For details not described in detail in the technical solution of the computer program, references can be made to the descriptions of the technical solution of the above-mentioned data processing method.

Some specific embodiments of this specification are described above. Other embodiments fall within the scope of the appended claims. In some cases, actions or steps described in the claims can be performed in a sequence different from that in some embodiments and desired results can still be achieved. In addition, processes described in the accompanying drawings do not necessarily require a specific order or a sequential order shown to achieve the desired results. In some implementations, multitasking and parallel processing are also possible or may be advantageous.

The computer instructions include computer program code, and the computer program code may be in the form of source code, object code, an executable file, some intermediate forms, etc. The computer-readable medium can include any entity or apparatus capable of including computer program code, a recording medium, a USB flash disk, a removable hard disk, a magnetic disk, an optical disk, a computer memory, a read-only memory (ROM), a random access memory (RAM), an electrical carrier signal, a telecommunications signal, a software distribution medium, etc. It is worthwhile to note that the content of the computer-readable medium can be appropriately incremented or decremented in accordance with the demands of legislation and patent practice within jurisdictions. For example, in some jurisdictions, the computer-readable medium does not include the electrical carrier signal or the telecommunications signal in accordance with legislation and patent practice.

It is worthwhile to note that to make the description brief, the above-mentioned method embodiments are expressed as a combination of a series of actions. However, a person skilled in the art should appreciate that the embodiments of this specification are not limited to the described action sequence because some steps can be performed in other sequences or performed simultaneously according to the embodiments of this specification. In addition, a person skilled in the art should also appreciate that all the embodiments described in this specification are examples of embodiments, and the actions and modules mentioned are not necessarily mandatory to the embodiments of this specification.

In the above-mentioned embodiments, the descriptions of the embodiments have respective focuses. For a part not described in detail in an embodiment, references can be made to related descriptions in other embodiments.

The examples of the embodiments of this specification disclosed above are merely intended to help describe this specification. The optional embodiments do not describe all details in detail, and this application is not limited to the specific implementations. Clearly, many modifications and changes can be made based on the content of the embodiments of this specification. These embodiments are selected and described in detail in this specification to better explain principles and practical applications of the embodiments of this specification, so that a person skilled in the art can better understand and use this specification. This specification is limited only by the claims and all the scope and equivalents thereof.

What is claimed is:

1. A computer implemented system for encoding, comprising:
   one or more computers; and
   one or more computer memory devices interoperably coupled with the one or more computers and having tangible, non-transitory, machine-readable media storing one or more instructions that, when executed by the one or more computers, perform one or more operations for encoding, comprising:
   encoding, using an encoding layer, a received first modal initial feature vector and a received second modal initial feature vector, to generate, respectively, a first modal feature vector and a second modal feature vector; and
   performing, using at least one joint encoding unit, joint encoding on the first modal feature vector and the second modal feature vector, wherein the at least one joint encoding unit comprises an encoding module and a modal input switching module, and wherein:

processing, using the modal input switching module, the first modal feature vector and the second modal feature vector, to obtain, respectively a first modal switching encoding vector and a second modal switching encoding vector, and processing, using the encoding module, the first modal switching encoding vector and the second modal switching encoding vector, to generate, respectively a first target modal fusion vector and a second target modal fusion vector.

2. The computer implemented system of claim 1, wherein a quantity of the at least one joint encoding unit is two or more, wherein two or more joint encoding units constitute a joint encoding unit group and the joint encoding unit group performs joint encoding on the first modal feature vector and the second modal feature vector to generate, respectively the first target modal fusion vector and the second target modal fusion vector, and wherein output information of a first joint encoding unit in any two adjacent joint encoding units in the joint encoding unit group is input into an input end of a second joint encoding unit.

3. The computer implemented system of claim 1, comprising one or more instructions for using the modal input switching module for:

determining a first modal feature global vector of the first modal feature vector and a second modal feature global vector of the second modal feature vector;

computing a feature matching value between the first modal feature global vector and the second modal feature global vector;

determining an initial classification probability value of the feature matching value based on a pre-trained feature selection classifier;

determining a simulated classification probability value based on the initial classification probability value;

selecting a target modal feature vector type based on the simulated classification probability value, wherein the target modal feature vector type comprises one of a first modal feature vector and a second modal feature vector of a current modal input switching module, and one of a first modal switching encoding vector and a second modal switching encoding vector that are input into a previous-layer encoding module that the current modal input switching module is connected to; and determining the first modal switching encoding vector and the second modal switching encoding vector based on the target modal feature vector type.

4. The computer implemented system of claim 1, comprising one or more instructions for using the encoding module for:

determining a first modal switching encoding global vector of the first modal switching encoding vector and a second modal switching encoding global vector of the second modal switching encoding vector;

computing a modal matching value between the first modal switching encoding global vector and the second modal switching encoding global vector;

determining an initial matching probability value of the modal matching value based on a pre-trained mode selection classifier;

determining a simulated matching probability value based on the initial matching probability value;

selecting a target attention mechanism based on the simulated matching probability value, wherein the target attention mechanism comprises one of a self-attention mechanism, a first cross self-attention mechanism, a second cross self-attention mechanism, and a joint self-attention mechanism; and respectively performing self-attention computation on the first modal switching encoding vector and the second modal switching encoding vector based on the target attention mechanism, to generate, respectively, a first target modal fusion vector and a second target modal fusion vector.

5. The computer implemented system of claim 4, comprising one or more instructions for using the encoding layer for:

determining a first modal initial feature global vector of the received first modal initial feature vector and a second modal initial feature global vector of the received second modal initial feature vector;

computing an initial feature matching value between the first modal initial feature global vector and the second modal initial feature global vector;

determining an initial feature classification probability value of the initial feature matching value based on a pre-trained initial feature selection classifier;

determining a simulated initial feature classification probability value based on the initial feature classification probability value;

selecting an initial attention mechanism based on the simulated initial feature classification probability value, wherein the initial attention mechanism comprises one of a self-attention mechanism, a first cross self-attention mechanism, a second cross self-attention mechanism, a joint self-attention mechanism; and respectively performing self-attention computation on the received first modal initial feature vector and the received second modal initial feature vector based on the initial attention mechanism, to generate the first modal feature vector and the second modal feature vector.

6. The computer implemented system of claim 1, comprising a preprocessing module.

7. The computer implemented system of claim 6, comprising one or more instructions for using the preprocessing module for:

receiving multimodal initial data;

determining a data type of the multimodal initial data;

determining a position feature of the multimodal initial data;

extracting a data feature of the multimodal initial data; and generating a multimodal initial feature vector based on the data type, the position feature, and the data feature, wherein the multimodal initial feature vector comprises the received first modal initial feature vector and the received second modal initial feature vector.

8. A computer implemented method for encoding, comprising:

encoding, using an encoding layer, a received first modal initial feature vector and a received second modal initial feature vector, to generate, respectively, a first modal feature vector and a second modal feature vector; and performing, using at least one joint encoding unit, joint encoding on the first modal feature vector and the second modal feature vector, wherein the at least one joint encoding unit comprises an encoding module and a modal input switching module, and wherein:

processing, using the modal input switching module, the first modal feature vector and the second modal feature vector, to obtain, respectively a first modal switching encoding vector and a second modal switching encoding vector, and processing, using the encoding module, the first modal switching encoding vector and the second modal switching encoding vector, to generate, respectively a first target modal fusion vector and a second target modal fusion vector.

9. The computer implemented method of claim 8, wherein a quantity of the at least one joint encoding unit is two or more, wherein two or more joint encoding units constitute a joint encoding unit group and the joint encoding unit group performs joint encoding on the first modal feature vector and the second modal feature vector to generate, respectively the first target modal fusion vector and the second target modal fusion vector, and wherein output information of a first joint encoding unit in any two adjacent joint encoding units in the joint encoding unit group is input into an input end of a second joint encoding unit.

10. The computer implemented method of claim 8, comprising using the modal input switching module for:
determining a first modal feature global vector of the first modal feature vector and a second modal feature global vector of the second modal feature vector;
computing a feature matching value between the first modal feature global vector and the second modal feature global vector;
determining an initial classification probability value of the feature matching value based on a pre-trained feature selection classifier;
determining a simulated classification probability value based on the initial classification probability value;
selecting a target modal feature vector type based on the simulated classification probability value, wherein the target modal feature vector type comprises one of a first modal feature vector and a second modal feature vector of a current modal input switching module, and one of a first modal switching encoding vector and a second modal switching encoding vector that are input into a previous-layer encoding module that the current modal input switching module is connected to; and
determining the first modal switching encoding vector and the second modal switching encoding vector based on the target modal feature vector type.

11. The computer implemented method of claim 8, comprising using the encoding module for:
determining a first modal switching encoding global vector of the first modal switching encoding vector and a second modal switching encoding global vector of the second modal switching encoding vector;
computing a modal matching value between the first modal switching encoding global vector and the second modal switching encoding global vector;
determining an initial matching probability value of the modal matching value based on a pre-trained mode selection classifier;
determining a simulated matching probability value based on the initial matching probability value;
selecting a target attention mechanism based on the simulated matching probability value, wherein the target attention mechanism comprises one of a self-attention mechanism, a first cross self-attention mechanism, a second cross self-attention mechanism, and a joint self-attention mechanism; and respectively performing self-attention computation on the first modal switching encoding vector and the second modal switching encoding vector based on the target attention mechanism, to generate, respectively, a first target modal fusion vector and a second target modal fusion vector.

12. The computer implemented method of claim 11, comprising using the encoding layer for:
determining a first modal initial feature global vector of the received first modal initial feature vector and a second modal initial feature global vector of the received second modal initial feature vector;
computing an initial feature matching value between the first modal initial feature global vector and the second modal initial feature global vector;
determining an initial feature classification probability value of the initial feature matching value based on a pre-trained initial feature selection classifier;
determining a simulated initial feature classification probability value based on the initial feature classification probability value;
selecting an initial attention mechanism based on the simulated initial feature classification probability value, wherein the initial attention mechanism comprises one of a self-attention mechanism, a first cross self-attention mechanism, a second cross self-attention mechanism, a joint self-attention mechanism; and
respectively performing self-attention computation on the received first modal initial feature vector and the received second modal initial feature vector based on the initial attention mechanism, to generate the first modal feature vector and the second modal feature vector.

13. The computer implemented method of claim 8, comprising a preprocessing module.

14. The computer implemented method of claim 13, comprising using the preprocessing module for:
receiving multimodal initial data;
determining a data type of the multimodal initial data;
determining a position feature of the multimodal initial data;
extracting a data feature of the multimodal initial data; and
generating a multimodal initial feature vector based on the data type, the position feature, and the data feature, wherein the multimodal initial feature vector comprises the received first modal initial feature vector and the received second modal initial feature vector.

15. A non-transitory, computer-readable medium storing one or more instructions executable by a computer system to perform one or more operations for encoding, comprising:
encoding, using an encoding layer, a received first modal initial feature vector and a received second modal initial feature vector, to generate, respectively, a first modal feature vector and a second modal feature vector; and
performing, using at least one joint encoding unit, joint encoding on the first modal feature vector and the second modal feature vector, wherein the at least one joint encoding unit comprises an encoding module and a modal input switching module, and wherein:
processing, using the modal input switching module, the first modal feature vector and the second modal feature vector, to obtain, respectively a first modal switching encoding vector and a second modal switching encoding vector, and processing, using the encoding module, the first modal switching encoding vector and the second modal switching encoding vector, to generate, respectively a first target modal fusion vector and a second target modal fusion vector.

16. The non-transitory, computer-readable medium of claim 15, wherein a quantity of the at least one joint encoding unit is two or more, wherein two or more joint encoding units constitute a joint encoding unit group and the joint encoding unit group performs joint encoding on the first modal feature vector and the second modal feature vector to generate, respectively the first target modal fusion vector and the second target modal fusion vector, and wherein output information of a first joint encoding unit in any two adjacent joint encoding units in the joint encoding unit group is input into an input end of a second joint encoding unit.

17. The non-transitory, computer-readable medium of claim 15, comprising one or more instructions for using the modal input switching module for:
   determining a first modal feature global vector of the first modal feature vector and a second modal feature global vector of the second modal feature vector;
   computing a feature matching value between the first modal feature global vector and the second modal feature global vector;
   determining an initial classification probability value of the feature matching value based on a pre-trained feature selection classifier;
   determining a simulated classification probability value based on the initial classification probability value;
   selecting a target modal feature vector type based on the simulated classification probability value, wherein the target modal feature vector type comprises one of a first modal feature vector and a second modal feature vector of a current modal input switching module, and one of a first modal switching encoding vector and a second modal switching encoding vector that are input into a previous-layer encoding module that the current modal input switching module is connected to; and
   determining the first modal switching encoding vector and the second modal switching encoding vector based on the target modal feature vector type.

18. The non-transitory, computer-readable medium of claim 15, comprising one or more instructions for using the encoding module for:
   determining a first modal switching encoding global vector of the first modal switching encoding vector and a second modal switching encoding global vector of the second modal switching encoding vector;
   computing a modal matching value between the first modal switching encoding global vector and the second modal switching encoding global vector;
   determining an initial matching probability value of the modal matching value based on a pre-trained mode selection classifier;
   determining a simulated matching probability value based on the initial matching probability value;
   selecting a target attention mechanism based on the simulated matching probability value, wherein the target attention mechanism comprises one of a self-attention mechanism, a first cross self-attention mechanism, a second cross self-attention mechanism, and a joint self-attention mechanism; and
   respectively performing self-attention computation on the first modal switching encoding vector and the second modal switching encoding vector based on the target attention mechanism, to generate, respectively, a first target modal fusion vector and a second target modal fusion vector.

19. The non-transitory, computer-readable medium of claim 18, comprising one or more instructions for using, the encoding layer for:
   determining a first modal initial feature global vector of the received first modal initial feature vector and a second modal initial feature global vector of the received second modal initial feature vector;
   computing an initial feature matching value between the first modal initial feature global vector and the second modal initial feature global vector;
   determining an initial feature classification probability value of the initial feature matching value based on a pre-trained initial feature selection classifier;
   determining a simulated initial feature classification probability value based on the initial feature classification probability value;
   selecting an initial attention mechanism based on the simulated initial feature classification probability value, wherein the initial attention mechanism comprises one of a self-attention mechanism, a first cross self-attention mechanism, a second cross self-attention mechanism, a joint self-attention mechanism; and
   respectively performing self-attention computation on the received first modal initial feature vector and the received second modal initial feature vector based on the initial attention mechanism, to generate the first modal feature vector and the second modal feature vector.

20. The non-transitory, computer-readable medium of claim 15, comprising one or more instructions for using a preprocessing module for:
   receiving multimodal initial data;
   determining a data type of the multimodal initial data;
   determining a position feature of the multimodal initial data;
   extracting a data feature of the multimodal initial data; and
   generating a multimodal initial feature vector based on the data type, the position feature, and the data feature, wherein the multimodal initial feature vector comprises the received first modal initial feature vector and the received second modal initial feature vector,
   generating a multimodal initial feature vector based on the data type, the position feature, and the data feature, wherein the multimodal initial feature vector comprises the received first modal initial feature vector and the received second modal initial feature vector.

* * * * *